(12) United States Patent
Wang et al.

(10) Patent No.: US 12,051,473 B2
(45) Date of Patent: Jul. 30, 2024

(54) NON-VOLATILE MEMORY WITH PRECISE PROGRAMMING

(71) Applicant: WESTERN DIGITAL TECHNOLOGIES, INC., San Jose, CA (US)

(72) Inventors: Ming Wang, Shanghai (CN); Liang Li, Shanghai (CN)

(73) Assignee: Western Digital Technolologies, Inc., San Jose, CA (US)

( * ) Notice: Subject to any disclaimer, the term of this patent is extended or adjusted under 35 U.S.C. 154(b) by 202 days.

(21) Appl. No.: 17/852,129

(22) Filed: Jun. 28, 2022

(65) Prior Publication Data

US 2023/0420061 A1  Dec. 28, 2023

(51) Int. Cl.
| | |
|---|---|
| G11C 16/34 | (2006.01) |
| G11C 16/08 | (2006.01) |
| G11C 16/10 | (2006.01) |
| G11C 16/24 | (2006.01) |
| G11C 16/26 | (2006.01) |

(52) U.S. Cl.
CPC .......... G11C 16/3459 (2013.01); G11C 16/08 (2013.01); G11C 16/102 (2013.01); G11C 16/24 (2013.01); G11C 16/26 (2013.01); G11C 16/3404 (2013.01)

(58) Field of Classification Search
CPC ................................................. G11C 16/3459
See application file for complete search history.

(56) References Cited

U.S. PATENT DOCUMENTS

| | | | |
|---|---|---|---|
| 6,888,758 | B1 | 5/2005 | Hemink et al. |
| 7,020,026 | B2 | 3/2006 | Guterman et al. |
| 7,088,621 | B2 | 8/2006 | Guterman et al. |
| 7,092,290 | B2 | 8/2006 | Hemink |
| 10,964,377 | B2 * | 3/2021 | Kimura ............... G11C 11/5671 |
| 2007/0297247 | A1 * | 12/2007 | Hemink ................. G11C 16/12 365/195 |

(Continued)

OTHER PUBLICATIONS

Cho, Jiho et al., "A 512Gb 3-bit/Cell 7th-Generation 3D NAND Flash Memory with 184MB/s Write Throughput and 2.0Gb/s Interface", International Solid-State Circuits Conference, Mar. 30, 2021, pp. 12.

Primary Examiner — Douglas King
(74) Attorney, Agent, or Firm — Vierra Magen Marcus LLP

(57) ABSTRACT

Memory cells are programmed to threshold voltage distributions that correspond to data states by applying a series of voltage pulses to a selected word line connected to a set of non-volatile memory cells selected for programming. Tighter threshold voltage distributions will result in fewer errors when reading the data at a later time. To create tighter threshold voltage distributions during programming, the system slows down the programming of memory cells as the memory cells approach their target threshold voltage by reducing the effective pulse width of the voltage pulses. The voltage pulses are divided into portions, with each portion corresponding to a subset of the pulse width or a subset of the time period that the voltage pulse is applied. Memory cells that are approaching their target threshold voltage will be slowed down by inhibiting those memory cells from programming during later-in-time portions of the voltage pulses.

20 Claims, 24 Drawing Sheets

(56) References Cited

U.S. PATENT DOCUMENTS

2013/0088917 A1* 4/2013 Park .................. G11C 16/10
  365/185.03
2022/0310167 A1* 9/2022 Ning .................. G11C 16/26

* cited by examiner

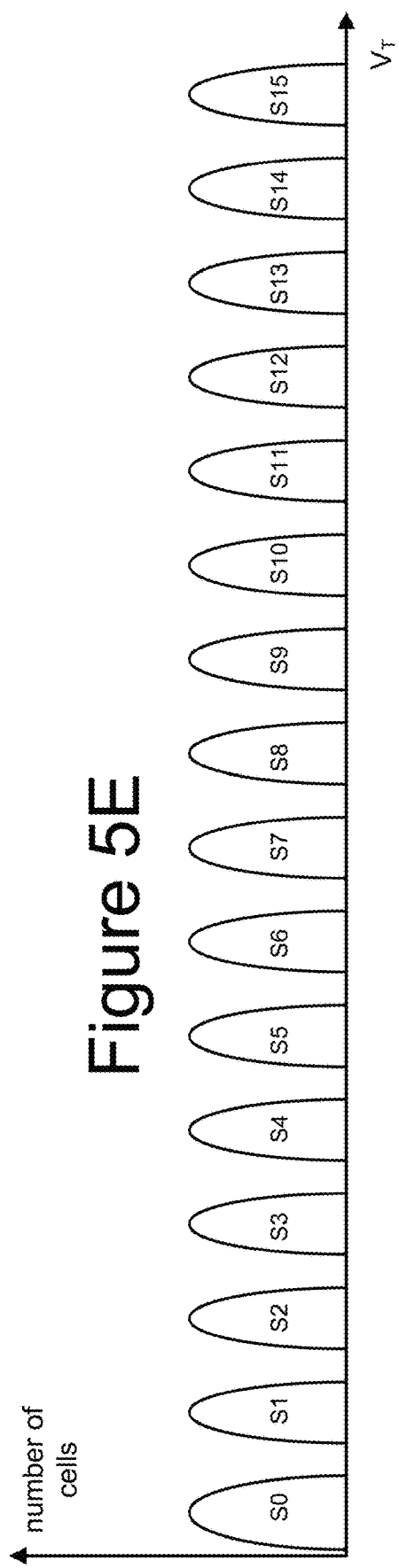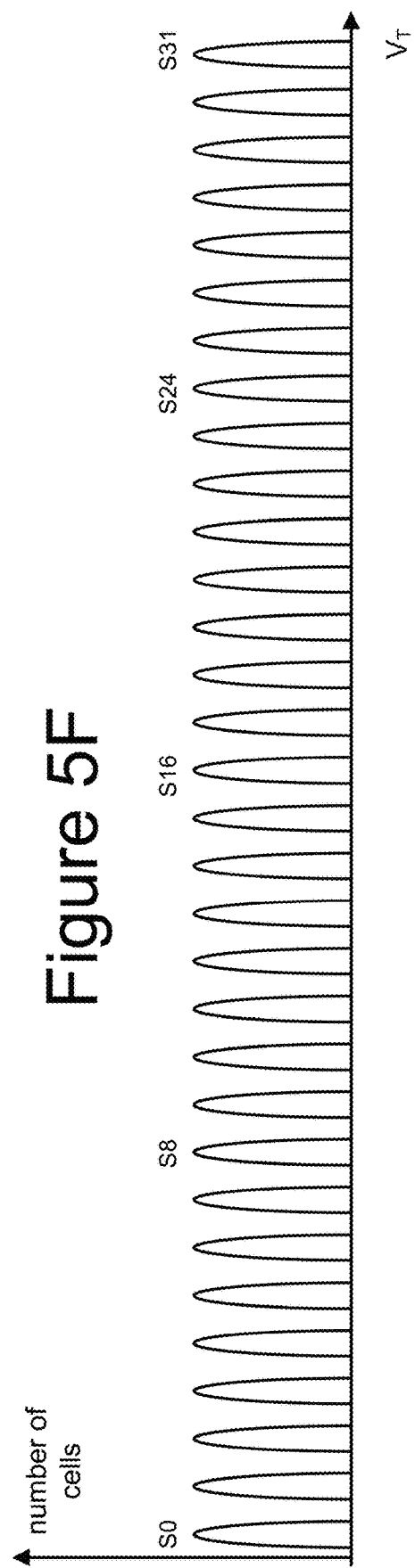

| Group of Memory Cells | Bit Line Voltage | |
|---|---|---|
| | First Portion | Second Portion |
| normal programming memory cells (804) | Vprogram | Vprogram |
| memory cells approaching target (806) | Vprogram | Vinhibit |
| inhibited memory cells (808) | Vinhibit | Vinhibit |

| Group of Memory Cells | Bit Line Voltage | | |
|---|---|---|---|
| | First Portion | Second Portion | Third Portion |
| normal programming memory cells (1404) | Vprogram | Vprogram | Vprogram |
| first group of memory cells approaching target (1406) | Vprogram | Vprogram | Vinhibit |
| second group of memory cells approaching target (1408) | Vprogram | Vinhibit | Vinhibit |
| inhibited memory cells (1410) | Vinhibit | Vinhibit | Vinhibit |

NON-VOLATILE MEMORY WITH PRECISE PROGRAMMING

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 5E depicts threshold voltage distributions.
FIG. 5F depicts threshold voltage distributions.

DETAILED DESCRIPTION

Memory cells are programmed to threshold voltage distributions that correspond to data states by applying a series of voltage pulses to a selected word line connected to a set of non-volatile memory cells selected for programming. Tighter threshold voltage distributions will result in fewer errors when reading the data at a later time. To create tighter threshold voltage distributions during programming, the system slows down the programming of memory cells as the memory cells approach their target threshold voltage by reducing the effective pulse width of the voltage pulses. The voltage pulses are divided into portions, with each portion corresponding to a subset of the pulse width or a subset of the time period that the voltage pulse is applied. Memory cells that are approaching their target threshold voltage will be slowed down by inhibiting those memory cells from programming during later-in-time portions of the voltage pulses.

Figure 1:
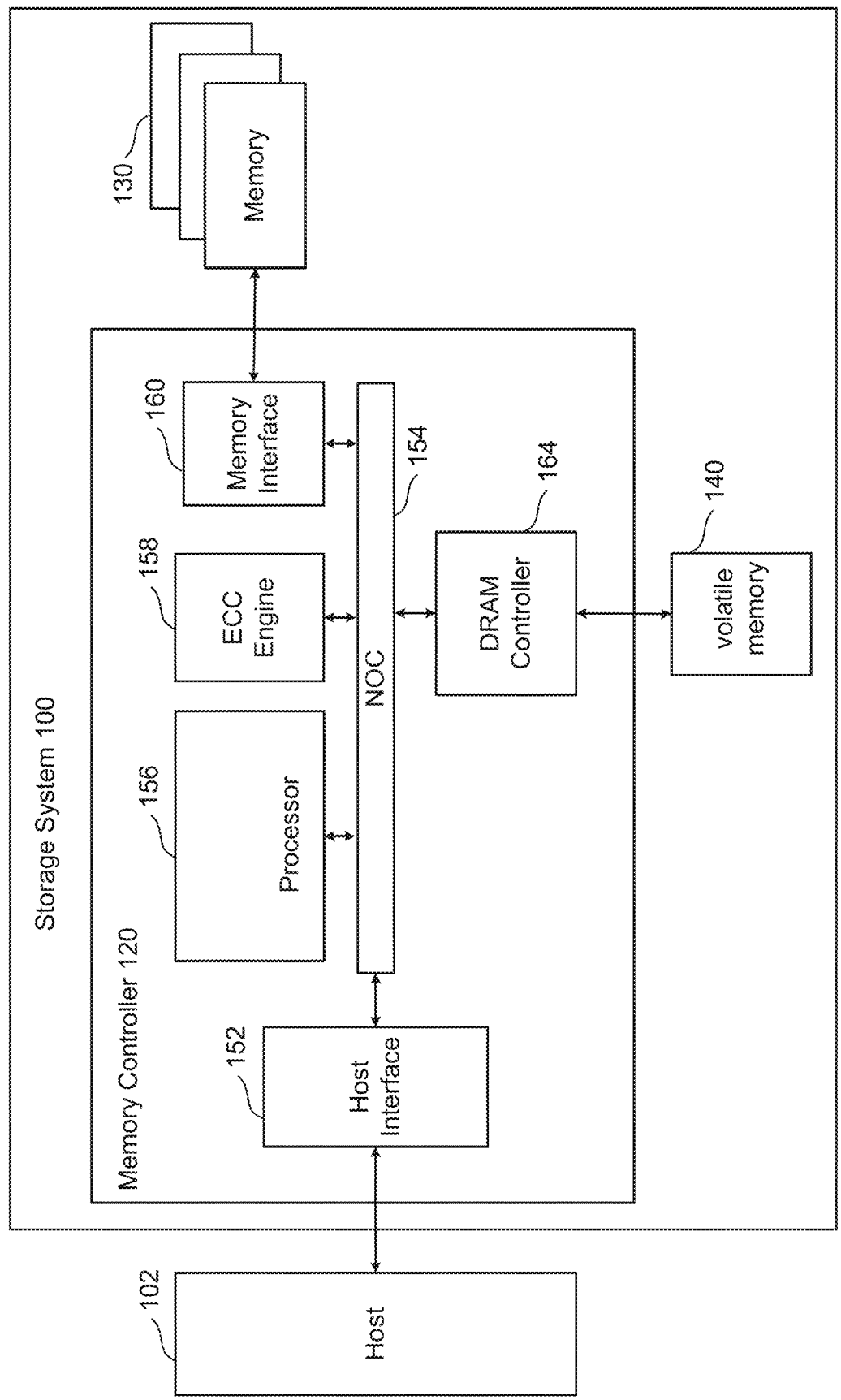
FIG. 1 is a block diagram depicting one embodiment of a storage system.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
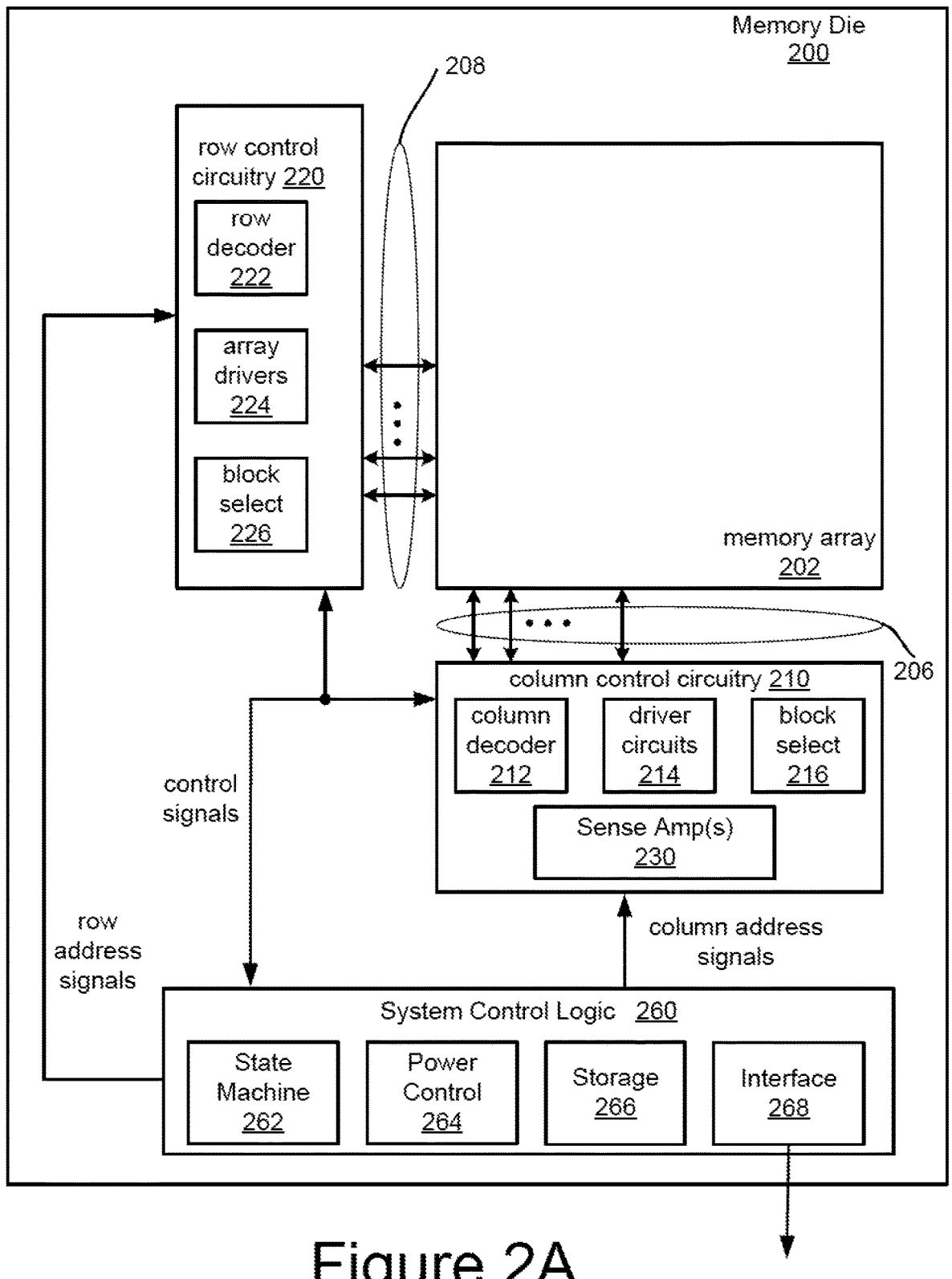
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366

(e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
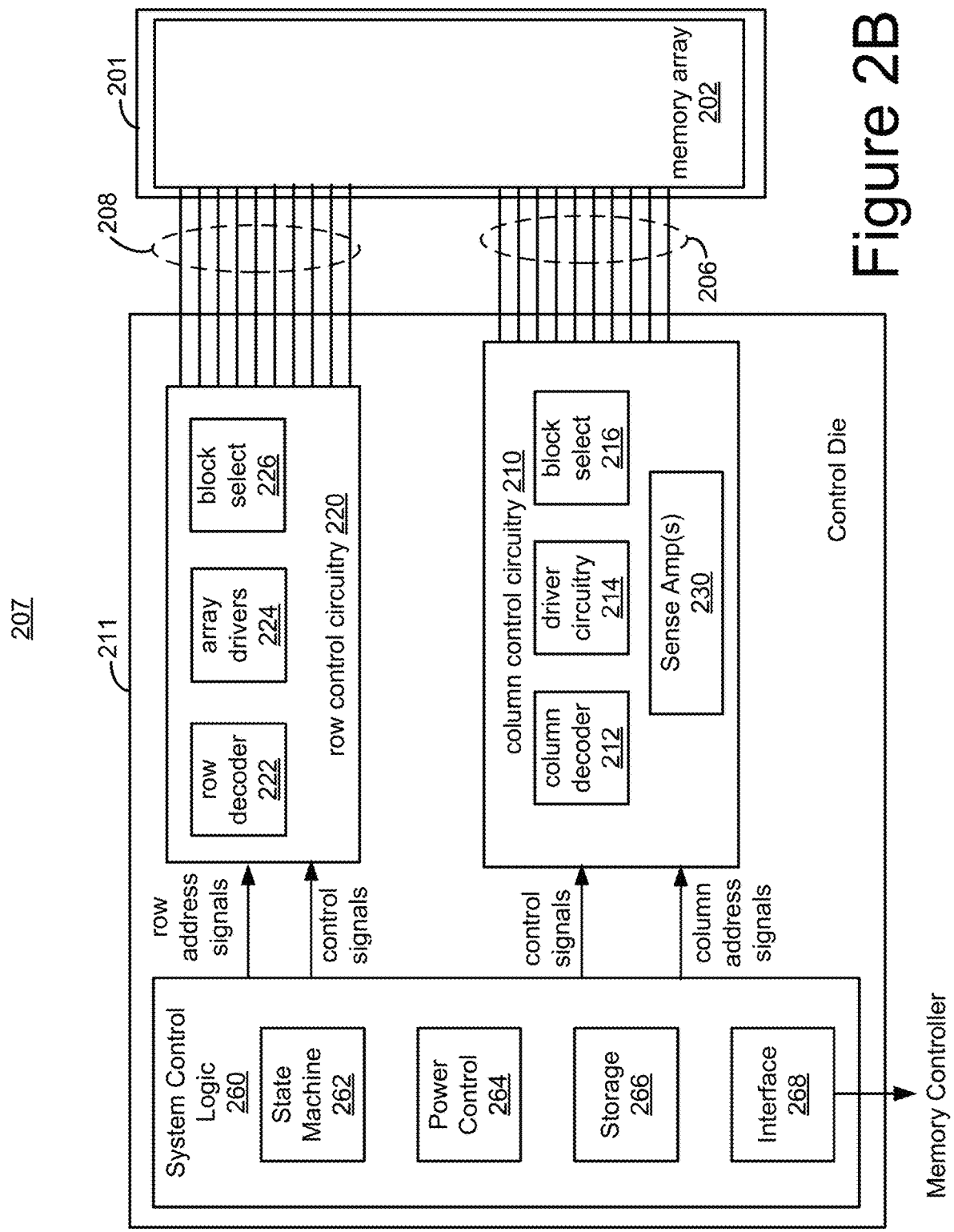
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
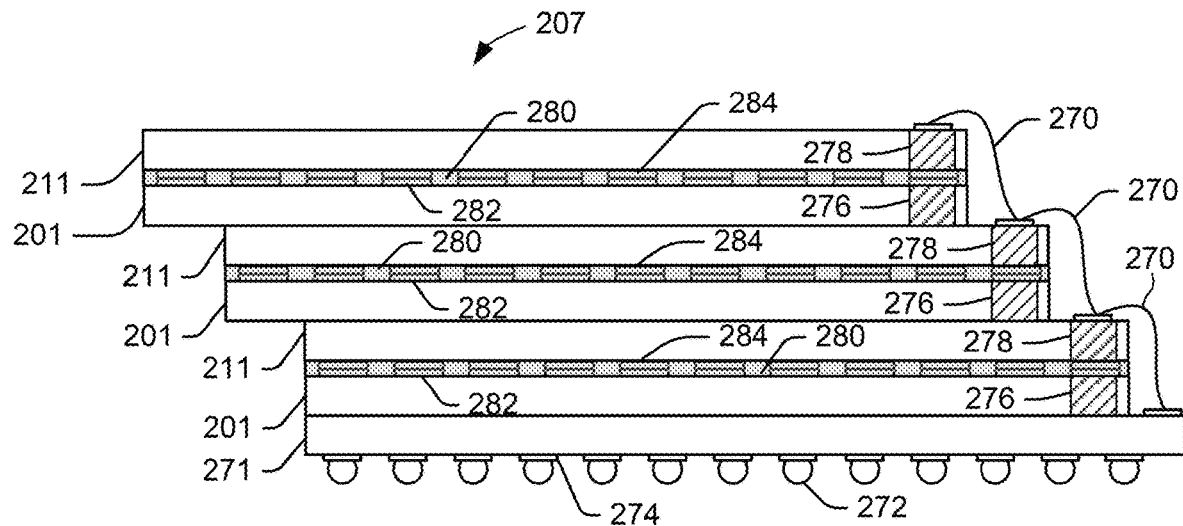
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
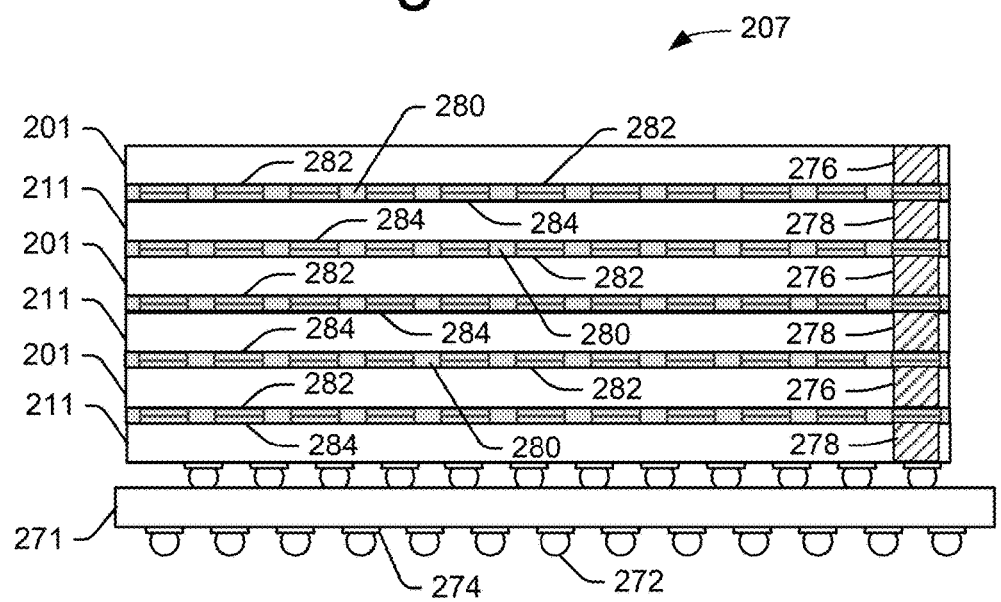

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
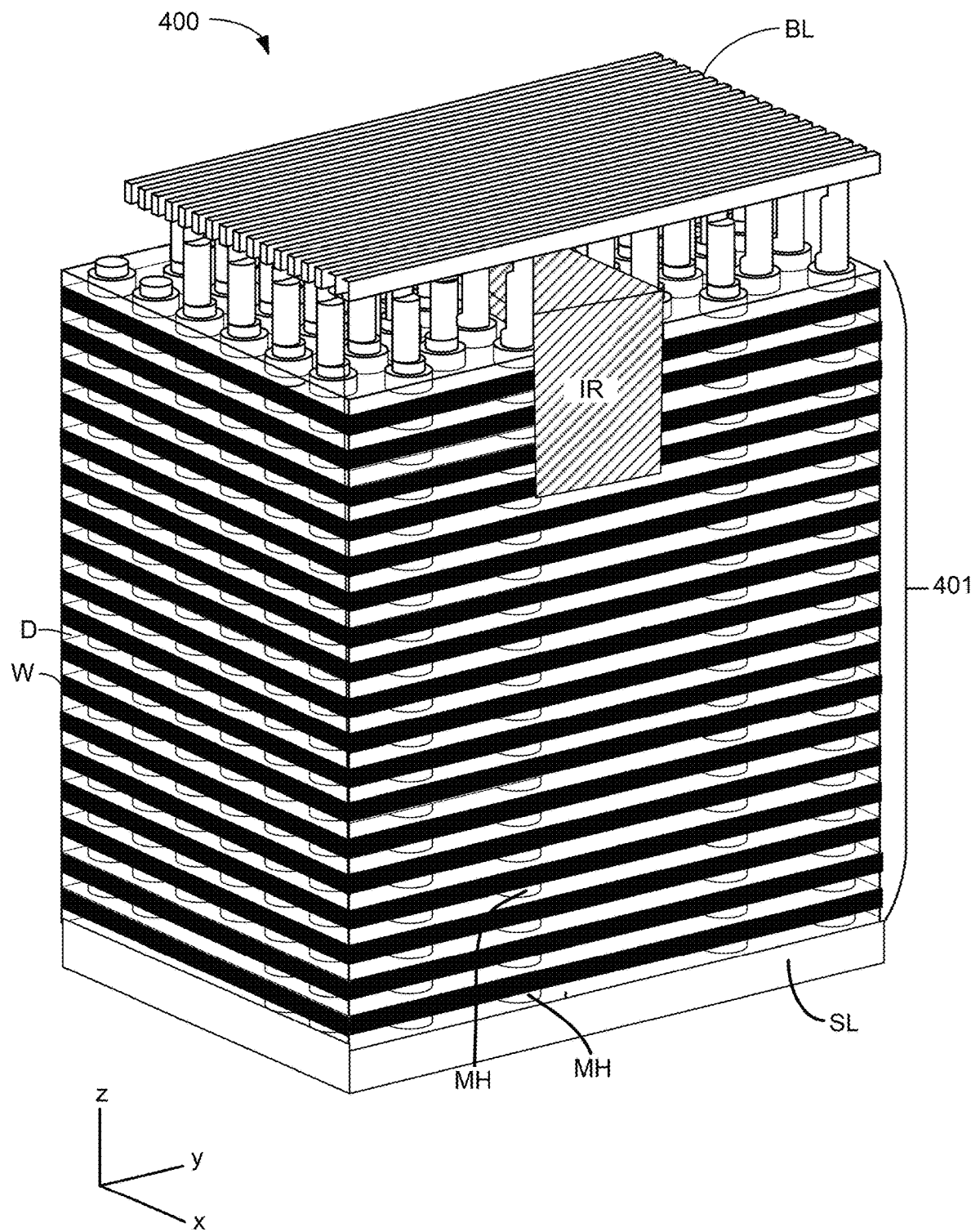
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
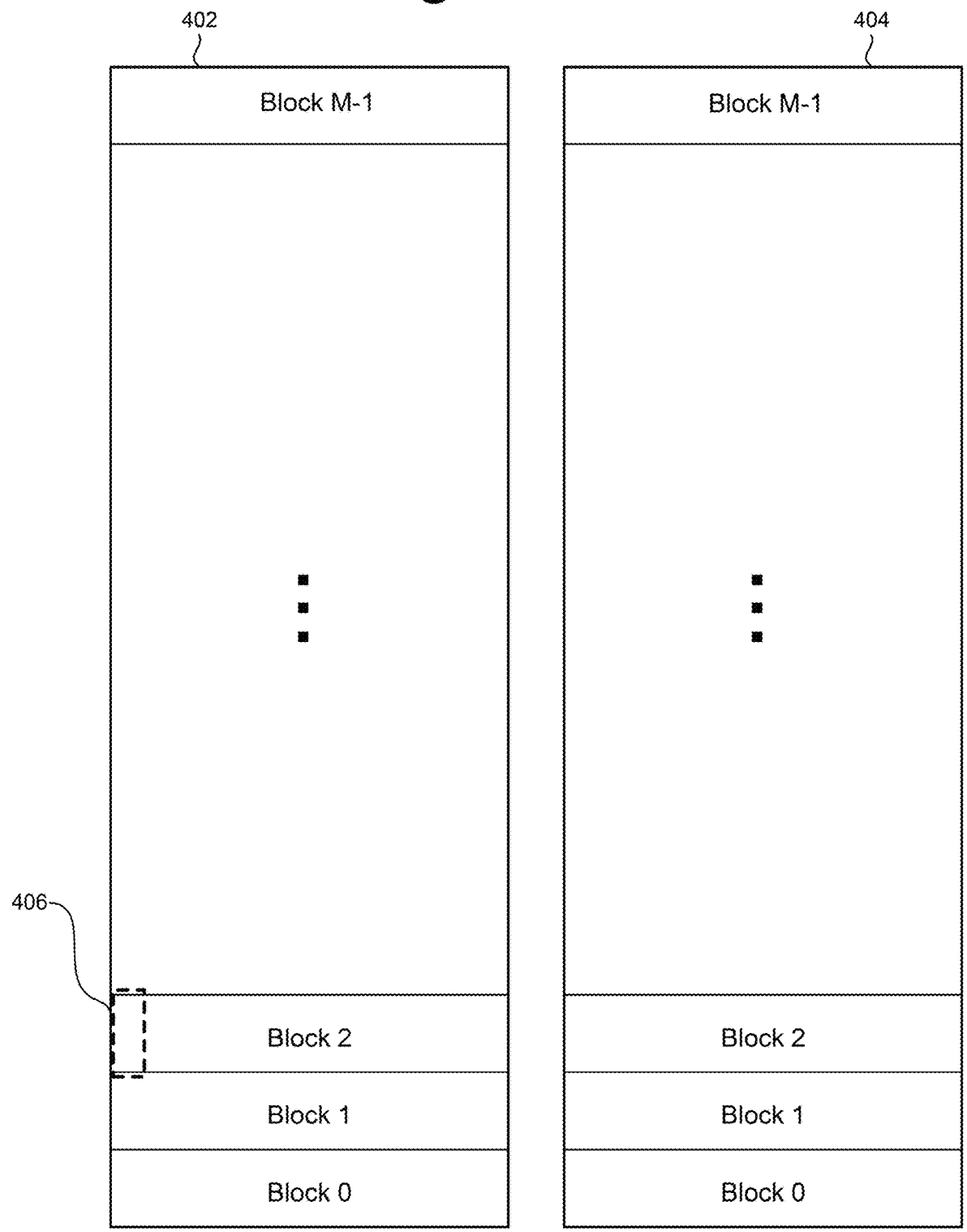
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight or more planes.

Figure 4B:
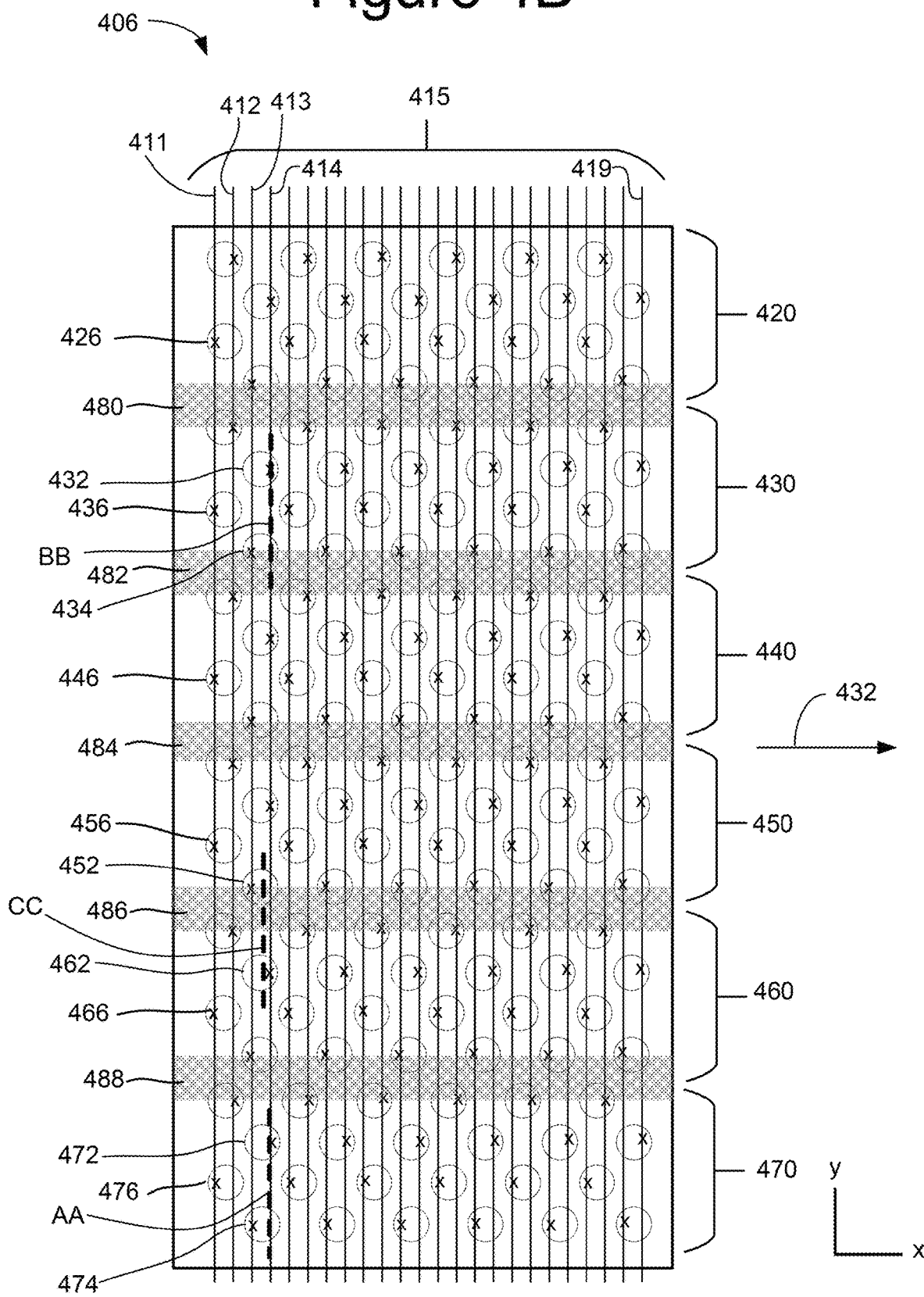
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
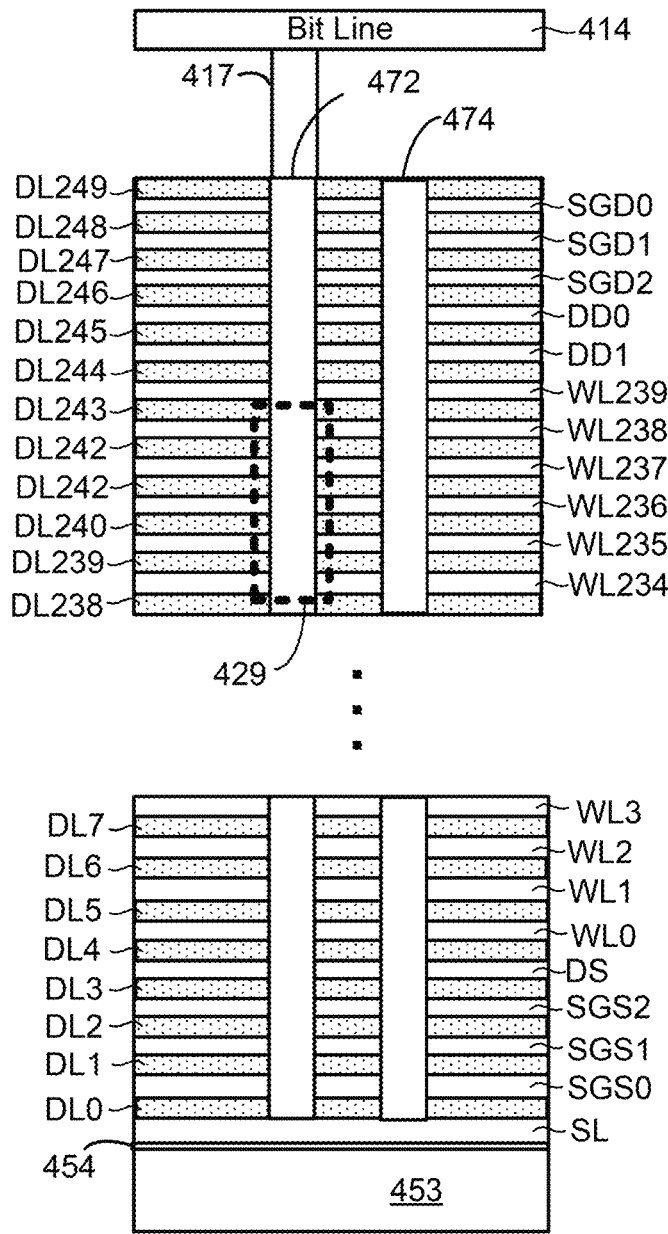
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2 (that form select lines); three source side select layers SGD2, SGS1, and SGS2 (that form select lines); three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
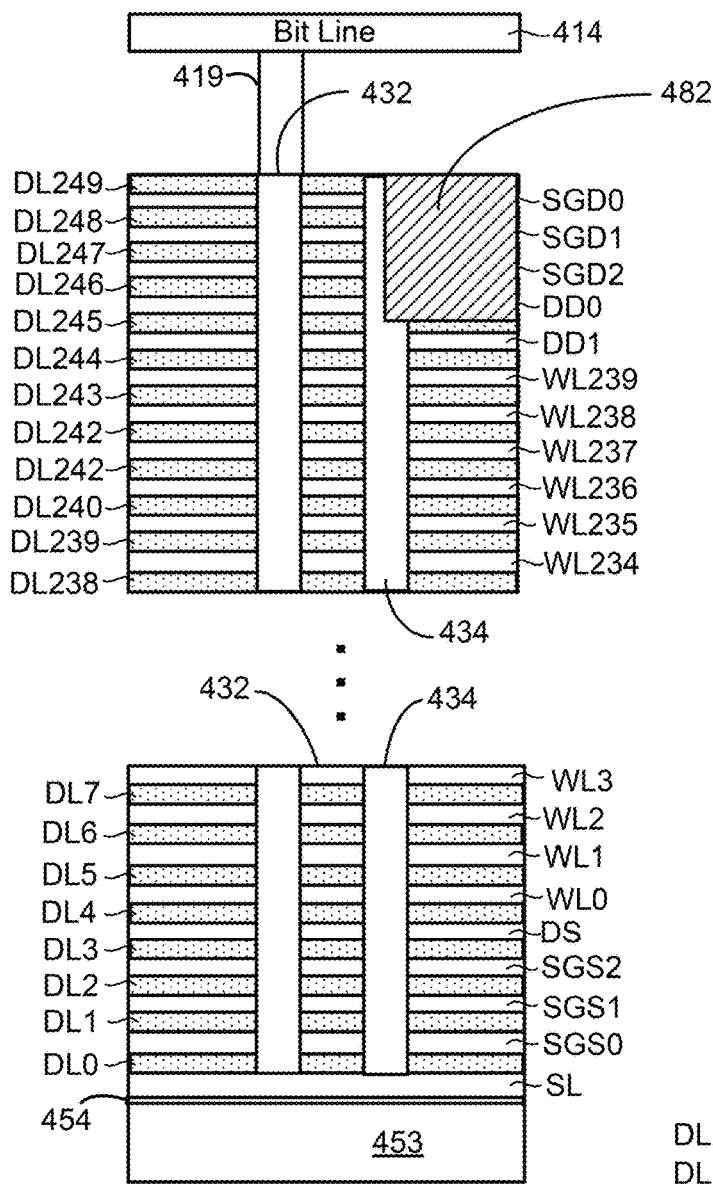
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/ NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
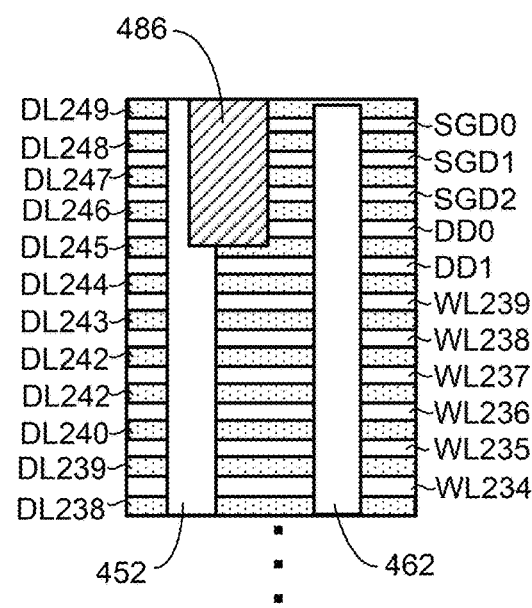
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
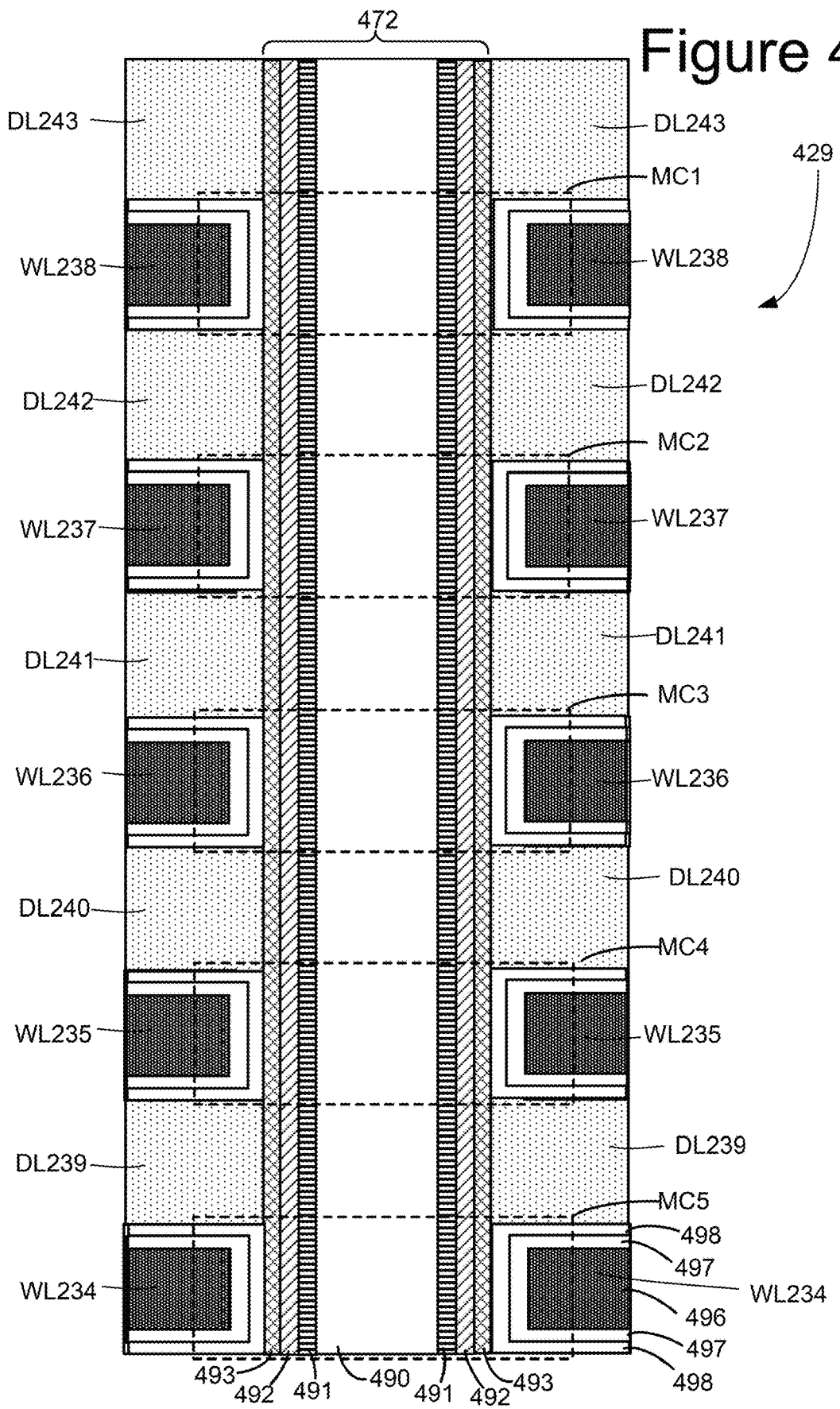
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DLL43, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
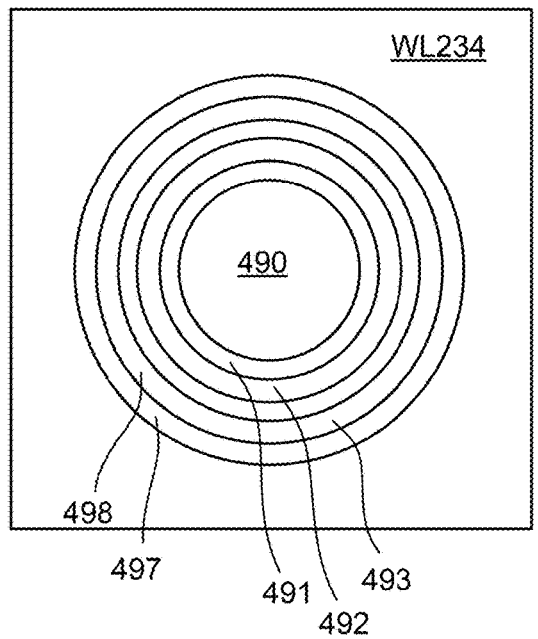
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
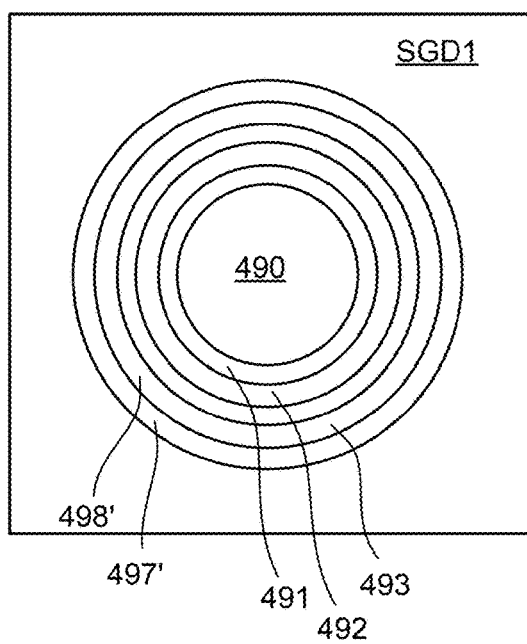
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
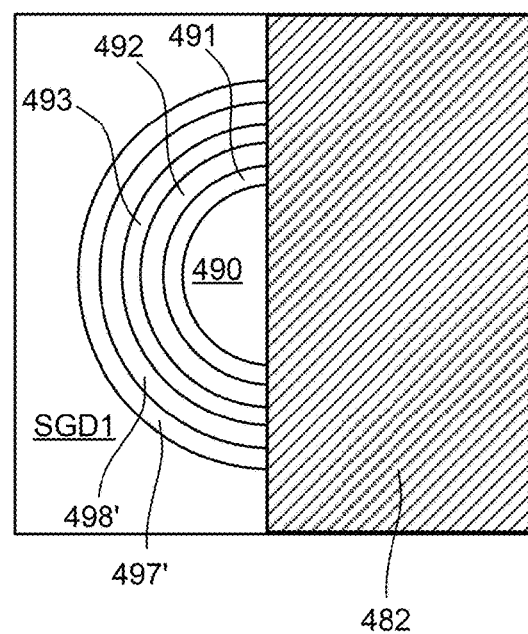
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
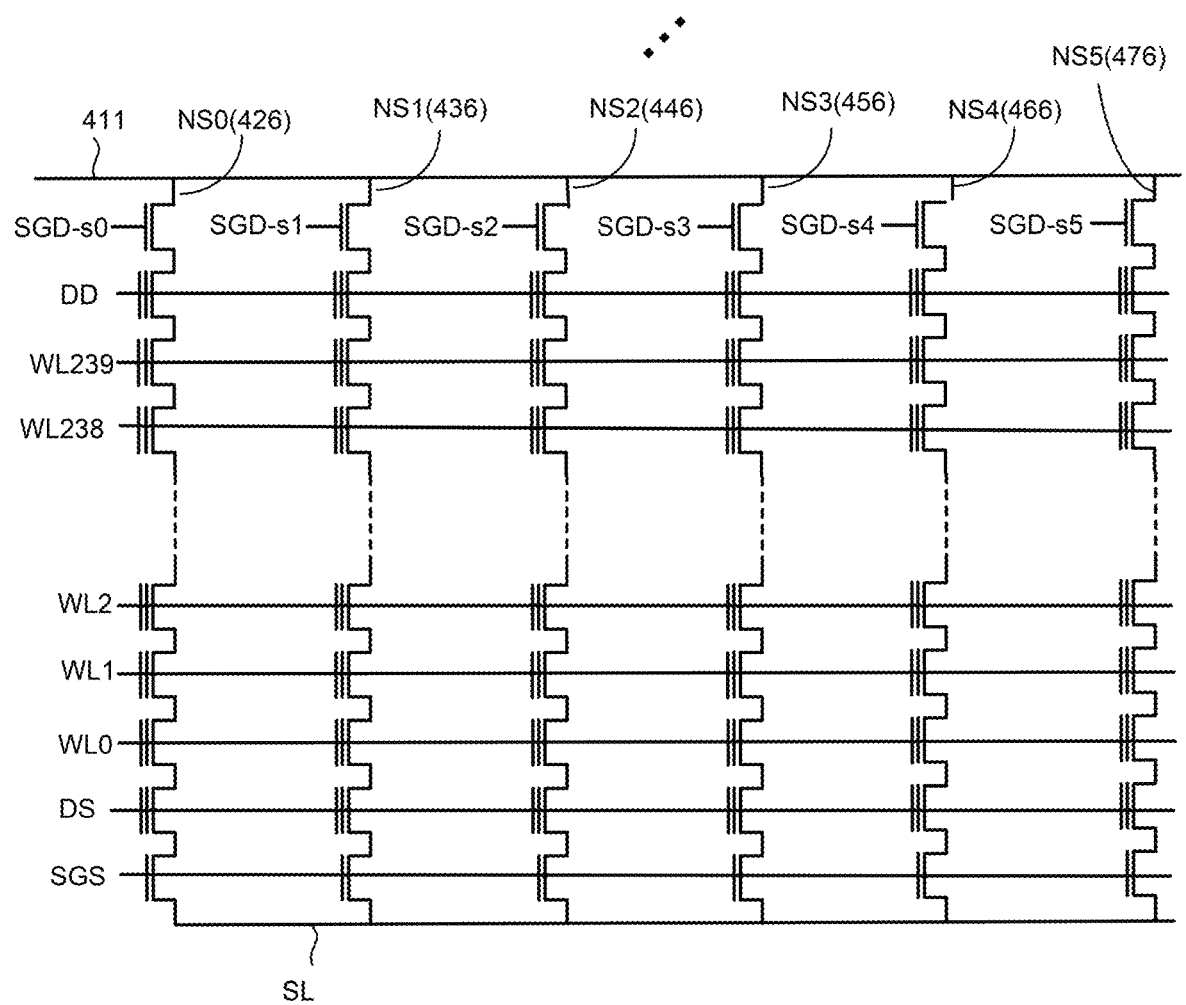
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
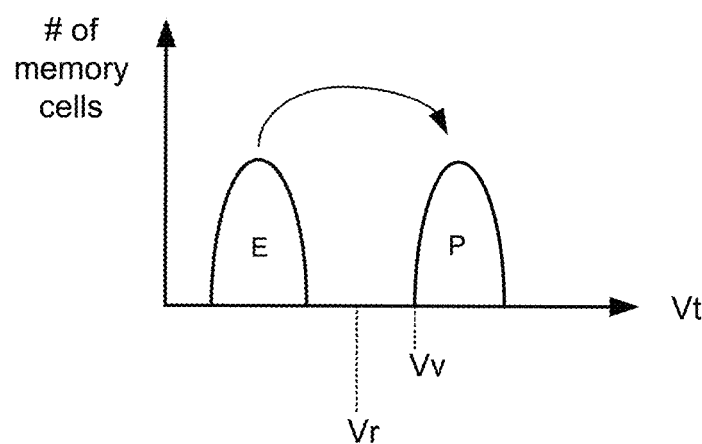
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
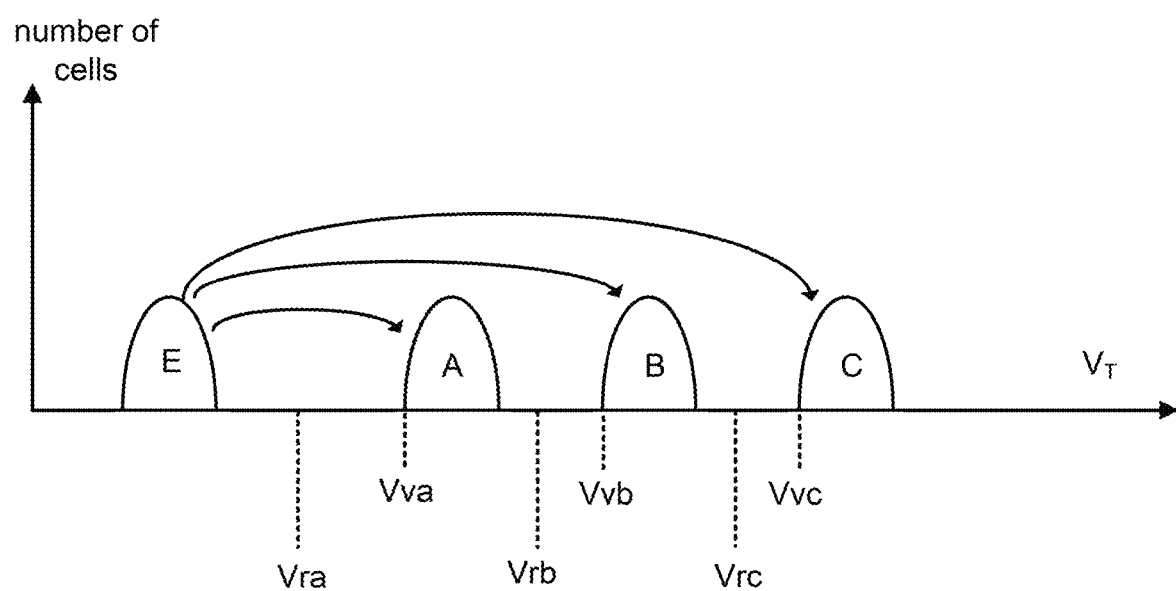
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
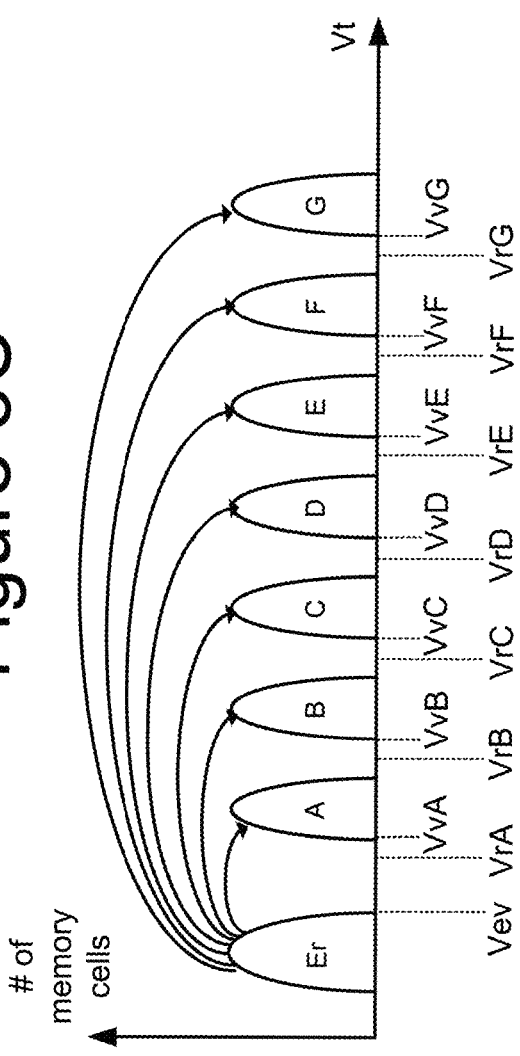
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
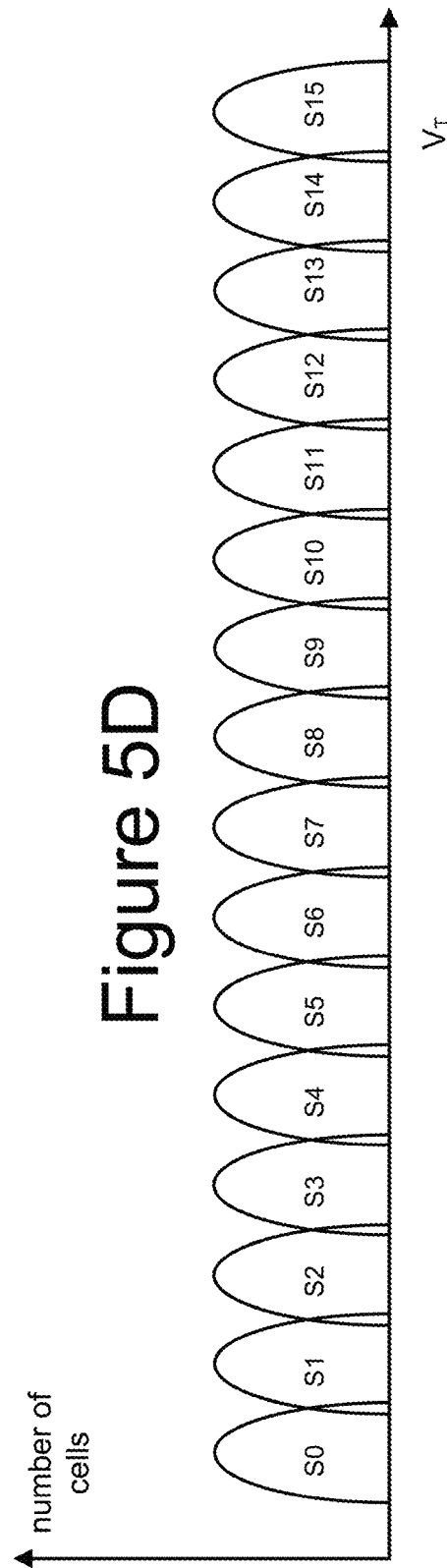
FIG. 5D depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
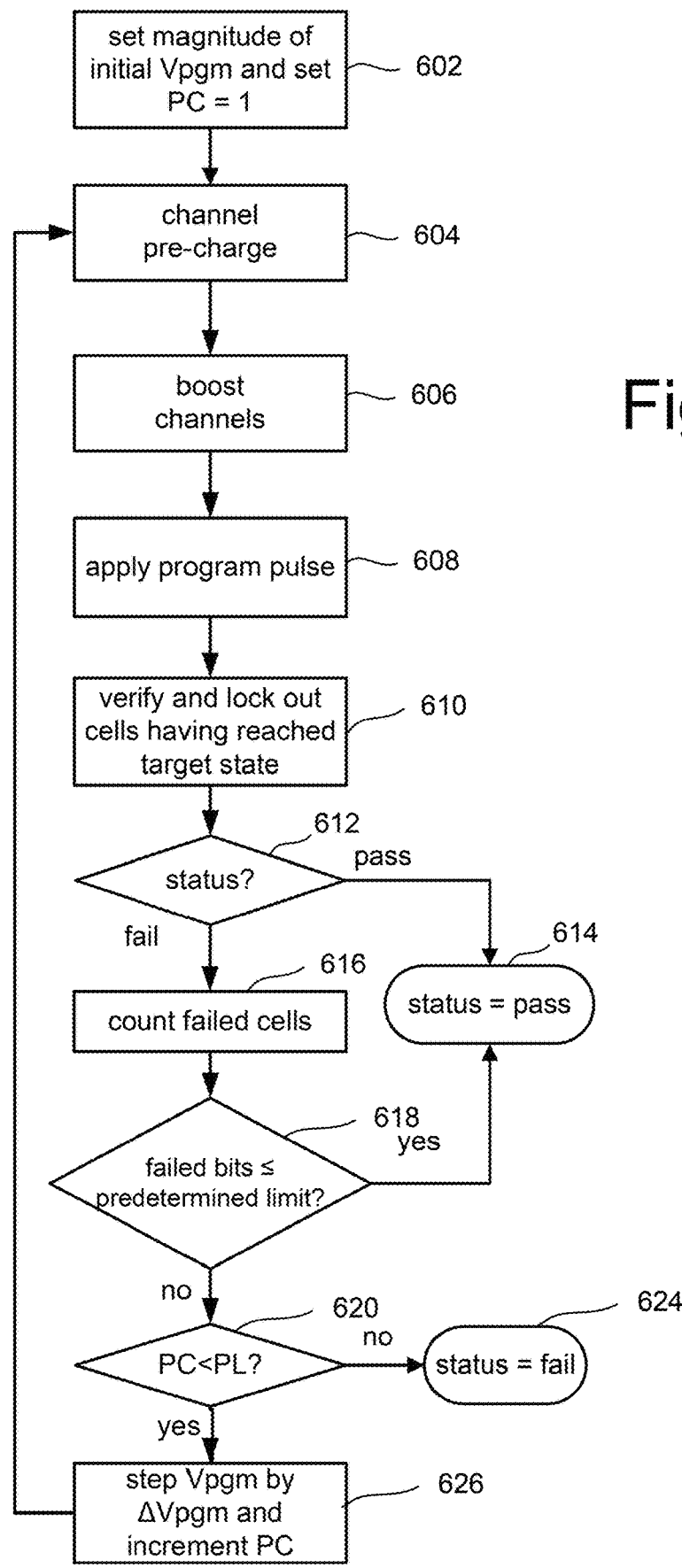
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming, which comprises programming processes that use multiple passes to complete programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse (also referred to as a voltage pulse) of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In one embodiment that corresponds to FIG. 5C, the process of FIG. 6 is concurrently performed for memory cells being programmed to data states A, B, C, D, E, F and G. In one embodiment, step 610 can include testing for each of data states A, B, C, D, E, F and G (e.g., testing to see whether memory cells have threshold voltages greater than VvA, VvB, VvC, VvD, VvE, VvF, and VvG). In another embodiment, the system only tests for a subset of data states A, B, C, D, E, F and G during each loop of steps 604-626 based on the current threshold voltages of the memory cells, in what is known as a smart verify process. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another loop (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

As depicted in FIGS. 5A-5F, memory cells are programmed to threshold voltage distributions that correspond to data states (e.g., data states Er-G of FIG. 5C) by applying a series of voltage pulses (each performance of step 608 is one voltage pulse) to a selected word line (WLn) connected to a set of non-volatile memory cells selected for programming. The selected word line is a common word line connected to each memory cell of the set of non-volatile memory cells selected for programming. Tighter threshold voltage distributions will result in fewer errors when reading the data at a later time. For example, if the threshold voltage distribution for data state C is too wide, it may include a lower tail that is below Vrc, which can lead to errors when read data. To create tighter threshold voltage distributions during programming, the system slows down the programming of memory cells as the memory cells approach their target threshold voltage by reducing the effective pulse width of the voltage pulses. In one embodiment, the voltage pulses are divided into portions, with each portion corresponding to a subset of the pulse width or a subset of the time period that the voltage pulse is applied. Memory cells that are approaching their target threshold voltage will be slowed down by inhibiting those memory cells from programming during later-in-time portions of the voltage pulses.

Figure 7:
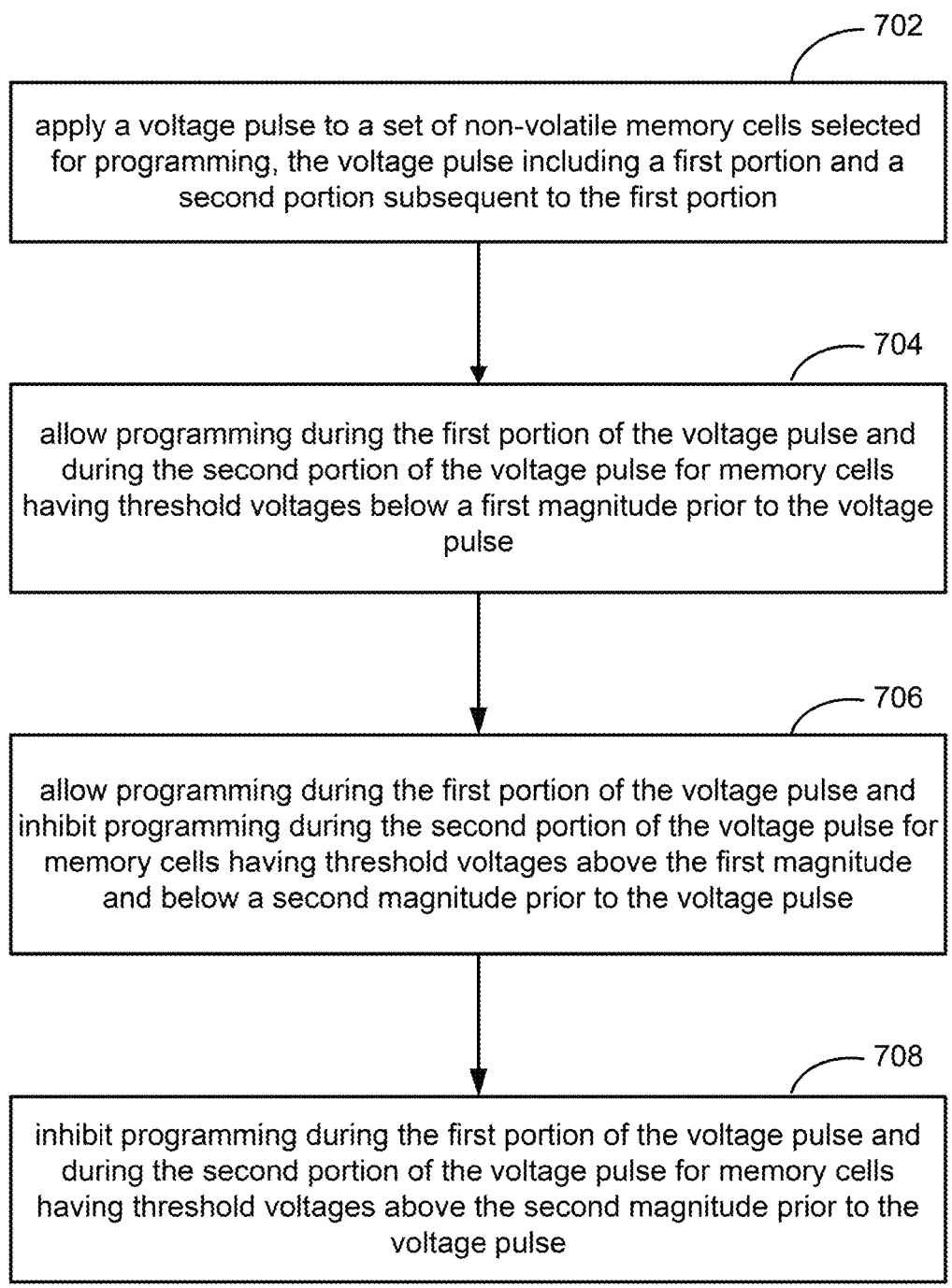
FIG. 7 is a flow chart describing one embodiment of a process for creating tighter threshold voltage distributions during programming.

FIG. 7 is a flow chart describing one embodiment of a process for creating tighter threshold voltage distributions during programming, including slowing down the programming of memory cells as the memory cells approach their target threshold voltage by reducing the effective pulse width of the voltage pulses. In one embodiment, the process of FIG. 7 is an example implementation of step 608 of FIG. 6. In one example embodiment, the process of FIG. 7 is performed by any of the embodiments of a control circuit discussed above. In one example embodiment, the process of FIG. 7 is performed by integrated memory assembly 207 using any of the embodiments of a control circuit discussed above of control die 211 to program memory cells (e.g., NAND strings of memory structure 202) on memory die 201. In one embodiment, the process of FIG. 7 is performed at the direction of state machine 262 (or another processor). In one embodiment, the control circuit includes multiple circuits on multiple die programming memory cells in multiple planes on multiple die. In one embodiment, the process of FIG. 7 is performed at the direction of (or by) memory controller 120 connected to one or multiple memory die and/or multiple integrated assemblies.

In step 702 of FIG. 7, the control circuit applies a voltage pulse to a set of non-volatile memory cells selected for programming. For example, the voltage pulse of step 608 is applied. The voltage pulse includes a first portion and a second portion subsequent to the first portion. In one embodiment, the voltage pulses are divided into portions, with each portion corresponding to a subset of the pulse width or a subset of the time period that the voltage pulse is applied. More details are provided below. In step 704, the control circuit allows programming during the first portion of the voltage pulse and during the second portion of the voltage pulse for memory cells having threshold voltages below a first magnitude prior to the voltage pulse. In step 706, the control circuit allows programming during the first portion of the voltage pulse and inhibits programming during the second portion of the voltage pulse for memory cells having threshold voltages above the first magnitude and below a second magnitude prior to the voltage pulse. The phrase "prior to the voltage pulse" is used to indicate that before the voltage pulse is applied the threshold voltage is the first magnitude and below the second magnitude. Step 706 comprises the slowing down of the programming for memory cells that are approaching their target threshold voltage (e.g., the verify compare voltages VvA, VvB, VvC, VvD, VvE, VvF, and VvG. of FIG. 5C) by reducing the effective pulse width of the voltage pulses. For example, for those memory cells being programmed to data state D (see e.g., FIG. 5C), as the threshold voltage of those memory cells get close to VvD, the programming of those memory cells will be slowed down by reducing the effective pulse width of the voltage pulses. In one embodiment, the control circuit reduces the effective pulse width of the voltage pulses by inhibiting programming during the second portion of the voltage pulse. In step 706, the control circuit inhibits programming during the first portion of the voltage pulse and during the second portion of the voltage pulse for memory cells having threshold voltages above the second magnitude prior to the voltage pulse. For example, those memory cells that have already reached their target threshold voltage will be inhibited from programming during the entire pulse width of a voltage pulse used to program.

Figures 8, 9:
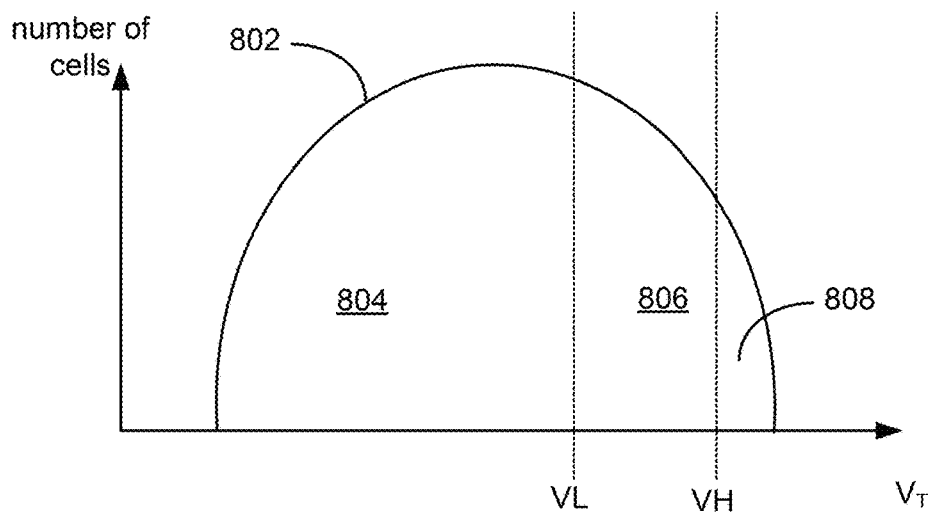
FIG. 8 depicts a threshold voltage distribution.
FIG. 9 is a table describing bit line voltages used during one embodiment of programming.

FIG. 8 depicts a threshold voltage distribution 802 of a population of memory cells being programmed using the process of FIG. 6, with the process of FIG. 7 being used during step 606. Threshold voltage distribution 802 represents the threshold voltages of the memory cells after the process of FIG. 6 has started and prior to the process of FIG. 6 being completed. Threshold voltage distribution 802 is divided into three regions: 804, 806 and 808. Region 804 includes memory cells having threshold voltages bellow VL volts (a first magnitude). When the each loop of steps 604-626 of FIG. 6 is performed (and the process of FIG. 7 is performed during step 608), the memory cells of region 804 have threshold voltages bellow VL volts (the first magnitude) prior to the next voltage pulse is applied and, therefore, in step 704 the control circuit allows programming for the memory cells of region 804 during the first and second portions of the voltage pulse of step 702.

Region 806 includes memory cells having threshold voltages above VL volts (the first magnitude) and below VH volts (a second magnitude). In one embodiment, VH represents the target threshold voltage (e.g., the verify compare voltages VvA, VvB, VvC, VvD, VvE, VvF, and VvG. of FIG. 5C). In one embodiment, VL is an intermediate voltage that is lower in voltage magnitude from VH by 0.1-0.8 volts. The memory cells of region 806 are the memory cells approaching their target threshold voltage and will have the effective pulse width of the voltage pulse reduced. That is, when the next loop of steps 604-626 of FIG. 6 is performed (and the process of FIG. 7 is performed during step 608), the memory cells of region 806 have threshold voltages above VL volts (the first magnitude) and below VH (the second magnitude) prior to the next voltage pulse is applied and, therefore, in step 706 the control circuit will reduce the effective pulse width of the voltage pulse by allowing programming for the memory cells of region 806 during the first portion of the voltage pulse of step 702 and inhibiting programming for the memory cells of region 806 during the second portion of the voltage pulse of step 702.

Region 808 includes memory cells having threshold voltages above VH volts (the second magnitude). The memory cells of region 808 are the memory cells that have reached their target threshold voltage and will be inhibited from programming. That is, when the next loop of steps 604-626 of FIG. 6 is performed (and the process of FIG. 7 is performed during step 608), the memory cells of region 808 have threshold voltages above VH (the second magnitude) prior to the next voltage pulse is applied and, therefore, in step 708 the control circuit will inhibit programming for the memory cells of region 808 during the first portion of the voltage pulse of step 702 and during the second portion of the voltage pulse of step 702.

FIG. 9 is a table describing bit line voltages used during the process of FIG. 7 for the memory cells of threshold voltage distribution 802 of FIG. 8. FIG. 9 lists two voltages that can be applied to bit lines during the process of FIG. 7: Vprogram and Vinhibit. When Vinhibit is applied to a bit line, the selected memory cell of the NAND string that is connected to the bit line that is receiving Vinhibit will be inhibited from programming. When Vprogram is applied to a bit line, the selected memory cell of the NAND string that is connected to the bit line that is receiving Vprogram will be programmed (e.g., have its threshold voltage changed). FIG. 9 shows that normal programming memory cells (e.g., the memory cells of region 804), will have their connected bit lines at Vprogram during the first and second portions of the voltage pulse so that programming is allowed during the first portion of the next voltage pulse and during the second portion of the next voltage pulse (see step 704). Memory cells approaching their target threshold voltage (e.g., the memory cells of region 806), will have their connected bit lines at Vprogram during the first portion of the next voltage pulse and at Vinhibit during the second portion of the next voltage pulse so that programming is allowed during the first portion of the next voltage pulse and programming is inhibited during the second portion of the next voltage pulse (see step 706). Memory cells that have reached their target threshold voltage will be inhibited from programming during the first portion of the next voltage pulse and during the second portion of the next voltage pulse (see step 708) by the control circuit applying Vinhibit to their connected bit lines during the first and second portions of the voltage pulse.

Figure 10:
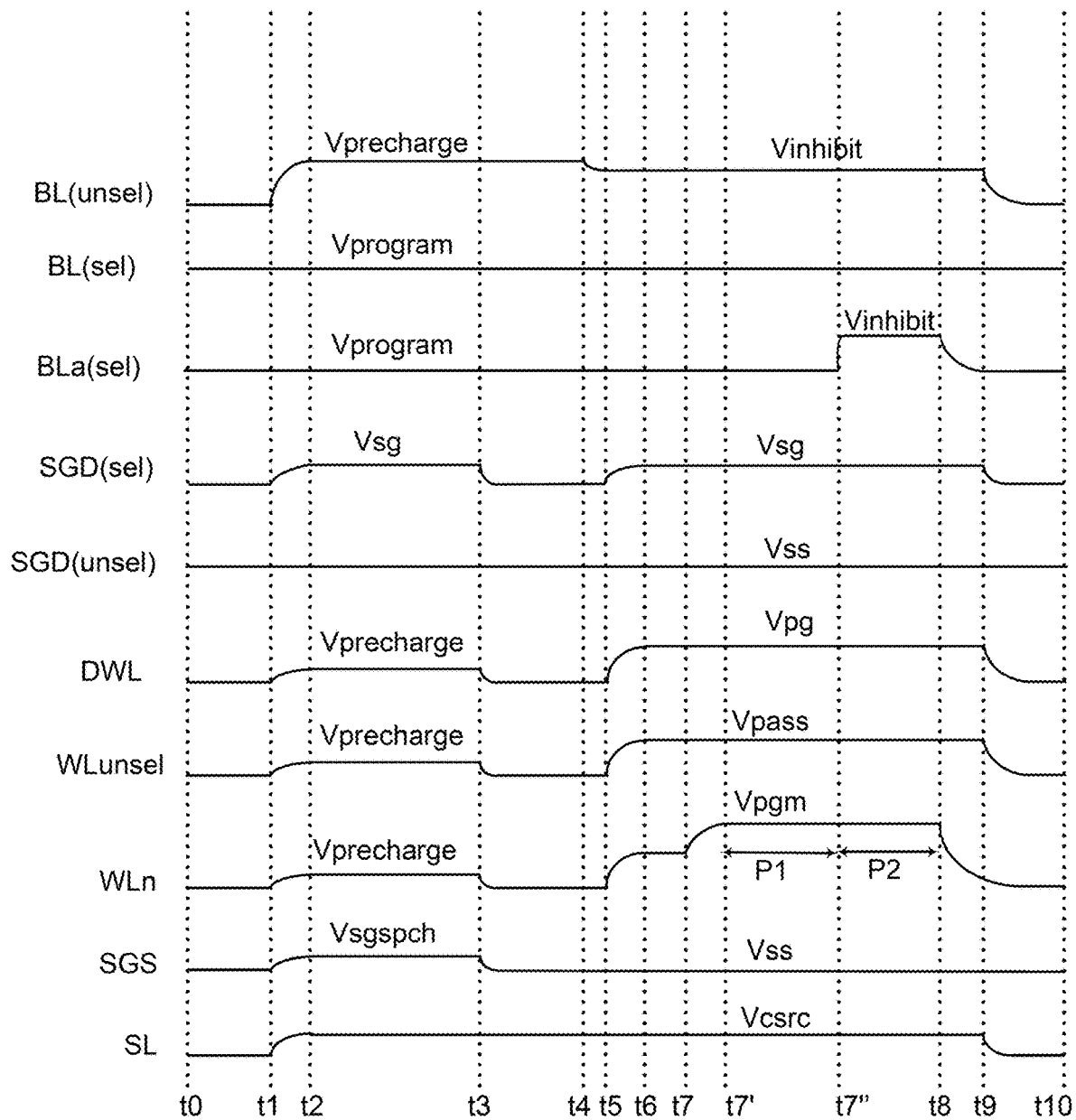
FIG. 10 is a timing diagram describing one embodiment of a process for creating tighter threshold voltage distributions during programming.

FIG. 10 is a timing diagram describing one embodiment of a process for creating tighter threshold voltage distributions during programming. FIG. 10 describes the behavior of the following signals during steps 604, 606 and 608 (as implemented by the process of FIG. 7): BL(unsel), BL(sel), BLa(sel), SGD(sel), SGD(unsel), DWL, WLunsel, WLn, SGS and SL. The signal BL(unsel) is the voltage applied to unselected bit lines (e.g., bit lines connected to NAND strings that are not selected to be programmed or were being programmed but are now being locked out because the selected memory cell being programmed reached its target). The signal BL(sel) is the bit line signal applied to bit lines connected to NAND strings that are selected for programming. The signal BLa(sel) is the bit line signal applied to bit lines connected to NAND strings that are selected for programming and have a memory cell selected for programming that is approaching its target. For example, BLa(sel) is applied to bit lines connected to NAND strings having a memory cell selected for programming that is in region 806 of threshold voltage distribution 802 due the memory cell having a threshold voltage above VL volts and below VH volts. The signal SGD(sel) is the drain side selection line (SGD) for the sub-block that is selected for programming. The signal SGD(unsel) is the is the drain side selection line (SGD) for the sub-blocks that are not selected for programming. The signal DWL is the voltage applied to the word lines connected to dummy memory cells (e.g., DD, DD1, DS), which are referred to as the dummy word lines. The signal WLunsel are the unselected word lines, meaning the word lines that are connected to memory cells that are not selected for programming at this time. The signal WLn is the selected word line (e.g., the word line that receives the voltage pulses of step 608). The signal SGS represents all of the source side select lines (see e.g., FIG. 4J). The signal SL is the source line signal (see e.g., FIG. 4J).

In one embodiment, the signal BL(sel) is set at Vprogram (e.g., Vss or 0 volts or ground) for the entire time period depicted in FIG. 10. Vprogram is a voltage magnitude that allows programming to occur for the selected memory cell on the NAND string connected to the bit line that receives Vprogram.

At time t1, BL(unsel) is raised from ground to a precharge voltage Vprecharge (e.g., ~3 volts) in order to allow for pre-charging as per step 604 of FIG. 6 At time t4, the unselected bit line voltage BL(unsel) is lowered to Vinhibit (~2.2 volts) and then the voltage is lowered down to ground at time t9. When a bit line is at Vinhbit, the channel of the NAND string will be cut off and, therefore, will boost up in response to the word line voltages. A boosted channel will not have a sufficient voltage differential as compared to the control gate; therefore, programming will be inhibited. The signal BLa(sel) is set at Vprogram until time t7", at which time BLa(sel) is raised Vinhibit. BLa(sel) is lowered to ground at time t8.

The signal SGD(unsel) is kept at Vss (e.g., 0 volts pr ground) for the entire time period depicted in FIG. 10. At time t1, SGD (sel) is raised to Vsg (e.g., 3-5 v) which is a voltage high enough to turn on the transistor for the select gate. This allows unselected NAND strings to be pre-charged and selected NAND strings to not be pre-charged between t2 and t3. The voltage for SGD(sel) is lowered to ground at time t3, raised to Vsg at t5, and lowered to ground at t9. The source side select line SGS is raised to Vsgspch (e.g., ~1 volt) at time t1 and lowered to Vss (e.g., 0 v or ground) at time t3. The source line SL is raised from ground to Vcsrc (e.g., 2.5-3.5 volts) at time t1 and then lowered to ground at time t9.

The unselected word lines WLunsel are raised to Vprecharge at time t1, lowered to ground at time t3, raised to a pass voltage Vpass (e.g., 8-9 volts) at time t5, and lowered to ground at time t9. The signal WLunsel is set to Vprecharge in order to allow the pre-charging of step 604 of FIG. 6 and then raised to a pass voltage Vpass in order to allow the boosting of step 606 of FIG. 6.

The dummy word lines DWL are raised to Vprecharge at time t1, lowered to ground at time t3, raised to Vpg (e.g., 3-6 volts) at time t5, and lowered to ground at time t9. The signal DWL is set to Vprecharge in order to allow the pre-charging of step 604 of FIG. 6 and then raised to a Vpg in order to allow the boosting of step 606 of FIG. 6.

The signal WLn is raised to Vprecharge at time t1, lowered to ground at time t3, raised to the pass voltage Vpass at time t5, raised to Vpgm (the programming voltage pulse for the current loop of FIG. 6) at time t7, and lowered down to ground at time t8.

The voltage on WLn between t7 and t8 represents the voltage pulse used for programming in step 608 and step 702. The voltage pulse on WLn includes a first portion P1 (e.g., between t7' and t7") and a second portion P2 (e.g., between t7" and t8) subsequent to the first portion. In one embodiment, step 704 of FIG. 7 includes the control circuit allowing programming during first portion P1 and during second portion P2 for memory cells having threshold voltages below VL by maintaining BL(sel) at Vprogram during P1 and P2. In one embodiment, step 706 of FIG. 7 includes the control circuit allowing programming during first portion P1 and inhibiting programming during second portion P2 for memory cells having threshold voltages above VL and below VH by maintaining BLa(sel) at Vprogram during P1 and maintaining BLa(sel) at Vinhibit during P2. In one embodiment, step 708 of FIG. 7 includes the control circuit inhibiting programming during first portion P1 and inhibiting programming during second portion P2 for memory cells having threshold voltages above VH by maintaining BL(unsel) at Vinhibit during P1 and during P2.

FIGS. 7-10 describe one embodiment of a programming system that uses a target threshold voltage (e.g., VH) and one intermediate voltage (e.g., VL). FIGS. 11-16 describe an embodiment of a programming system that uses a target threshold voltage and two intermediate voltages.

Figure 11:
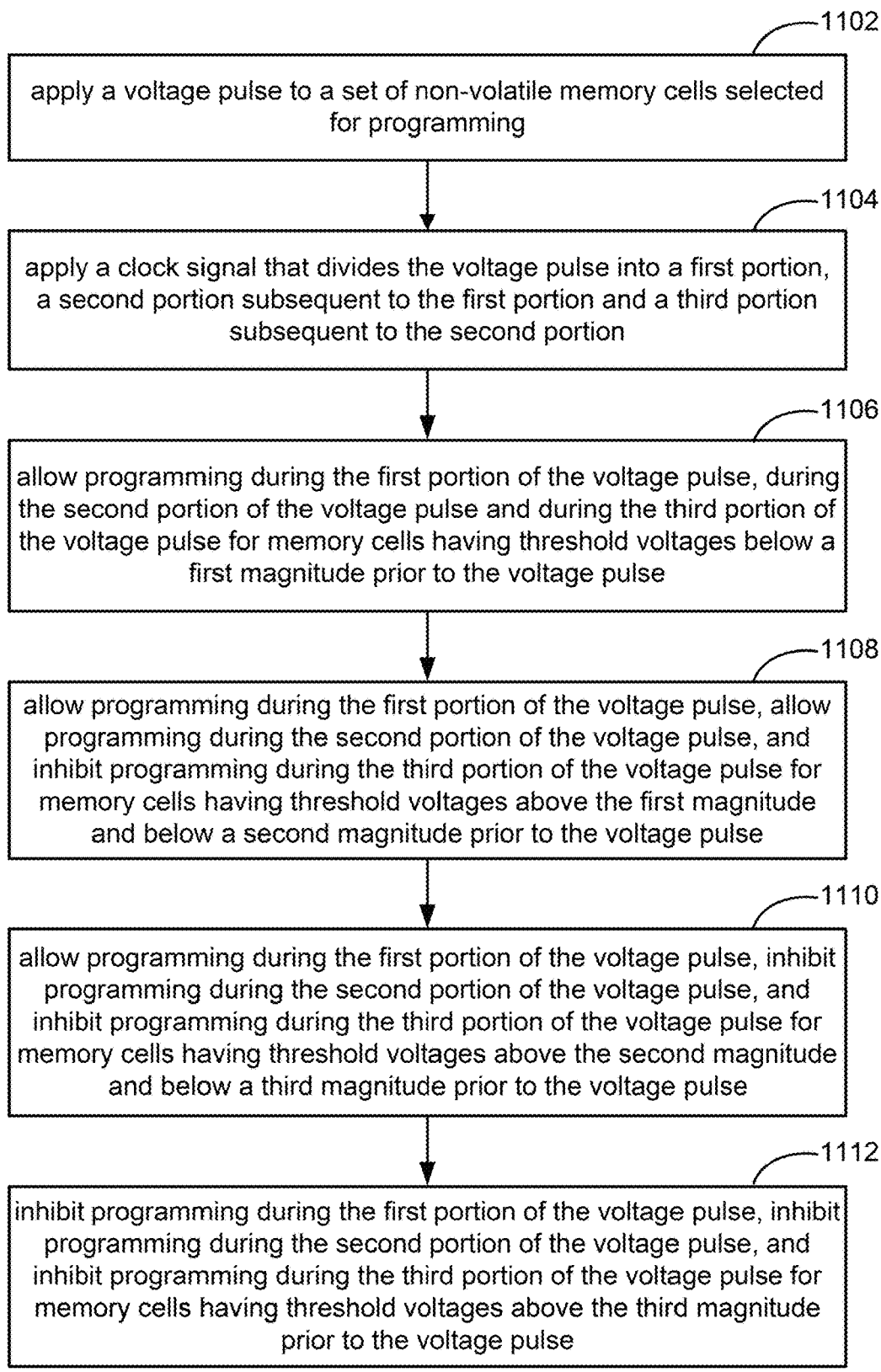
FIG. 11 is a flow chart describing one embodiment of a process for creating tighter threshold voltage distributions during programming.

FIG. 11 is a flow chart describing one embodiment of a process for creating tighter threshold voltage distributions during programming, including slowing down the programming of memory cells as the memory cells approach their target threshold voltage by reducing the effective pulse width of the voltage pulses. In one embodiment, the process of FIG. 11 is an example implementation of step 608 of FIG. 6. In one example embodiment, the process of FIG. 11 is performed by any of the embodiments of a control circuit discussed above. In one example embodiment, the process of FIG. 11 is performed by integrated memory assembly 207 using any of the embodiments of a control circuit discussed above of control die 211 to program memory cells (e.g., NAND strings of memory structure 202) on memory die

201. In one embodiment, the process of FIG. 11 is performed at the direction of state machine 262 (or another processor). In one embodiment, the control circuit includes multiple circuits on multiple die programming memory cells in multiple planes on multiple die. In one embodiment, the process of FIG. 11 is performed at the direction of (or by) memory controller 120 connected to one or multiple memory die and/or multiple integrated assemblies.

In step 1102, the control circuit applies a voltage pulse to a set of non-volatile memory cells selected for programming. For example, the voltage pulse of FIG. 608 is applied. As step 1102 recites one pulse being applied, the process of step 1102 is performed each time step 608 of FIG. 6 is performed. The voltage pulses are divided into portions, with each portion corresponding to a subset of the pulse width or a subset of the time period that the voltage pulse is applied. More details are provided below. In one embodiment, the voltage pulse includes a first portion, a second portion subsequent to the first portion and a third portion subsequent to the second portion. In step 1104, the control circuit applies a clock signal that divides the voltage pulse into the first portion, the second portion subsequent to the first portion and the third portion subsequent to the second portion. The clock signal can be generated by the control circuit, the memory controller, the host or another entity.

In step 1106, the control circuit allows programming during the first portion of the voltage pulse, during the second portion of the voltage pulse and during the third portion of the voltage pulse for memory cells having threshold voltages below a first magnitude prior to the voltage pulse.

In step 1108, the control circuit allows programming during the first portion of the voltage pulse, allows programming during the second portion of the voltage pulse, and inhibits programming during the third portion of the voltage pulse for memory cells having threshold voltages above the first magnitude and below a second magnitude prior to the voltage pulse. As mentioned above, the embodiment of FIG. 11 includes two intermediate voltages, which are referred to in FIG. 11 as the first magnitude and the second magnitude. The embodiment of FIG. 11 also includes a third magnitude that corresponds to target threshold voltage (e.g., the verify compare voltages VvA, VvB, VvC, VvD, VvE, VvF, and VvG. of FIG. 5C). Thus, there are two groups of memory cells that are approaching their target threshold voltage: a first group of memory cells approaching their target threshold voltage and a second group of memory cells approaching their target threshold voltage. The second group of memory cells approaching their target threshold voltage are closer to their target threshold voltage than the first group. For example, the first group of memory cells approaching their target threshold voltage have threshold voltages between the first magnitude and the second magnitude, while the second group of memory cells approaching their target threshold voltage have threshold voltages between the second magnitude and the third magnitude. Step 1108 includes the slowing down of the programming for the first group of memory cells approaching their target threshold voltage by reducing the effective pulse width of the voltage pulses by a first amount. Note that in one embodiment, the memory cells of the first group and the second group are being programmed to the same data states, while in other embodiments they are being programmed to different data states.

In step 1110, the control circuit allows programming during the first portion of the voltage pulse, inhibits programming during the second portion of the voltage pulse, and inhibits programming during the third portion of the voltage pulse for memory cells having threshold voltages above the second magnitude and below a third magnitude prior to the voltage pulse. Step 1110 includes the slowing down of the programming for the second group of memory cells approaching their target threshold voltage by reducing the effective pulse width of the voltage pulses by a second amount, where the second amount is greater than the first amount.

In step 1112, the control circuit inhibits programming during the first portion of the voltage pulse, inhibits programming during the second portion of the voltage pulse, and inhibits programming during the third portion of the voltage pulse for memory cells having threshold voltages above the third magnitude prior to the voltage pulse. For example, those memory cells that have already reached their target threshold voltage will be inhibited from programming during the entire pulse width of a voltage pulse used to program. Note that, in some embodiments, the steps of FIG. 11 can be performed in different orders than as depicted in FIG. 11.

Figure 12:
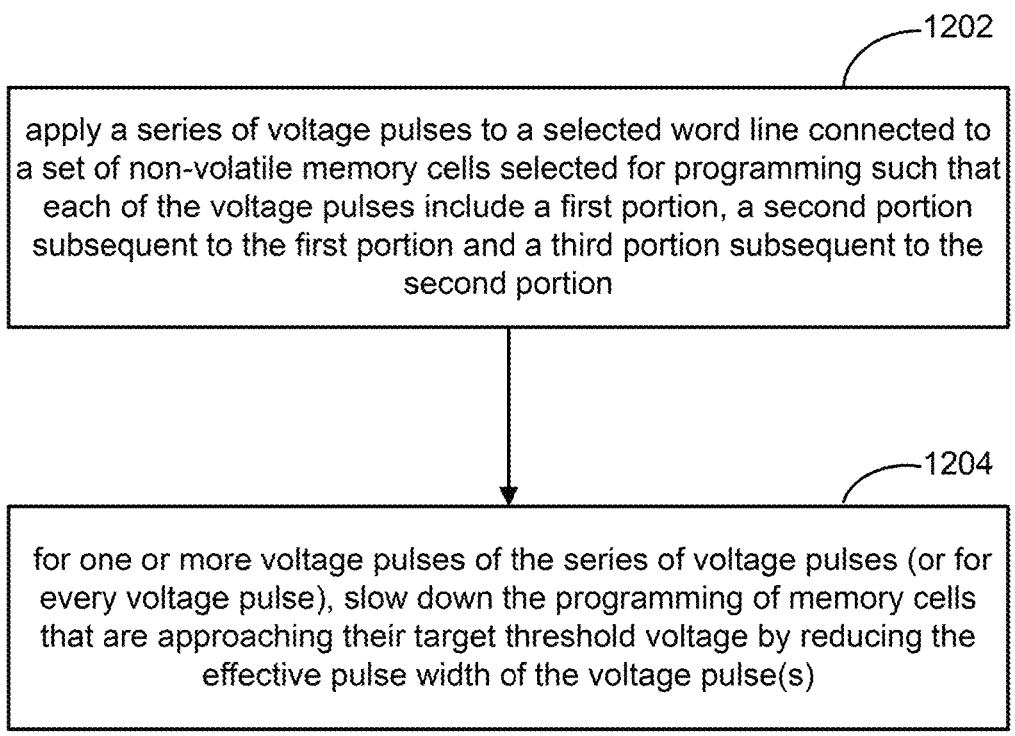
FIG. 12 is a flow chart describing one embodiment of a process for creating tighter threshold voltage distributions during programming.

FIG. 12 is a flow chart describing another embodiment of a process for creating tighter threshold voltage distributions during programming, including slowing down the programming of memory cells as the memory cells approach their target threshold voltage by reducing the effective pulse width of the voltage pulses. In one embodiment, the process of FIG. 12 is an example implementation of step 608 of FIG. 6. In one example embodiment, the process of FIG. 12 is performed by any of the embodiments of a control circuit discussed above. In one example embodiment, the process of FIG. 12 is performed by integrated memory assembly 207 using any of the embodiments of a control circuit discussed above of control die 211 to program memory cells (e.g., NAND strings of memory structure 202) on memory die 201. In one embodiment, the process of FIG. 12 is performed at the direction of state machine 262 (or another processor). In one embodiment, the control circuit includes multiple circuits on multiple die programming memory cells in multiple planes on multiple die. In one embodiment, the process of FIG. 12 is performed at the direction of (or by) memory controller 120 connected to one or multiple memory die and/or multiple integrated assemblies. In one embodiment, the process of FIG. 12 is an example implementation of the process of FIG. 11.

In step 1202, the control circuit applies a series of voltage pulses to a selected word line connected to a set of non-volatile memory cells selected for programming such that each of the voltage pulses include a first portion, a second portion subsequent to the first portion and a third portion subsequent to the second portion (e.g., as discussed above and described in more detail below). In one embodiment, step 1202 comprises performing step 608 multiple times (e.g., once for each time the loop of steps 604-628 is performed). In step 1204, for one or more voltage pulses of the series of voltage pulses (or for every voltage pulse), the control circuit slows down the programming of memory cells that are approaching their target threshold voltage by reducing the effective pulse width of the voltage pulse(s).

As mentioned above, the embodiment of FIG. 12 includes two intermediate voltages, which are referred to as the first magnitude and the second magnitude. The embodiment of FIG. 12 also includes a third magnitude that corresponds to target threshold voltage (e.g., the verify compare voltages VvA, VvB, VvC, VvD, VvE, VvF, and VvG. of FIG. 5C). Thus, like with FIG. 11, there are at least two groups of memory cells that are approaching their target threshold voltage: the first group of memory cells approaching their target threshold voltage and the second group of memory cells approaching their target threshold voltage. Step 1204 includes the slowing down of the programming for the first group of memory cells approaching their target threshold voltage by reducing the effective pulse width of the voltage pulses by the first amount and the slowing down of the programming for the second group of memory cells approaching their target threshold voltage by reducing the effective pulse width of the voltage pulses by the second amount, where the second amount is greater than the first amount.

Figure 13:
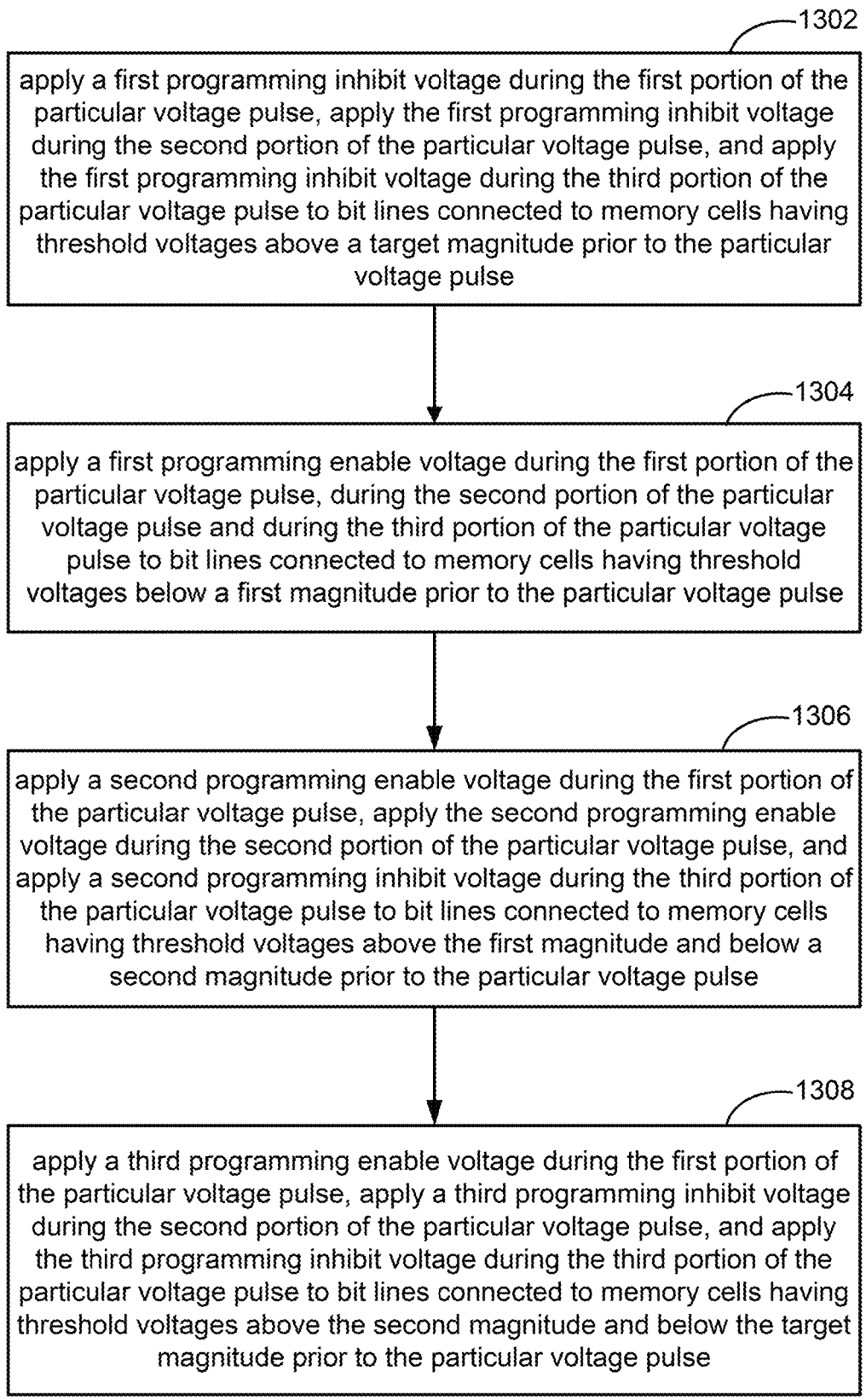
FIG. 13 is a flow chart describing one embodiment of a process that includes slowing down the programming of memory cells that are approaching their target threshold voltage by reducing the effective pulse width of a voltage pulse.

FIG. 13 is a flow chart describing one embodiment of a process that includes slowing down the programming of memory cells that are approaching their target threshold voltage by reducing the effective pulse width of a voltage pulse. Thus, the process of FIG. 13 is an example implementation of step 1204 of FIG. 12. In one example embodiment, the process of FIG. 13 is performed by any of the embodiments of a control circuit discussed above. In one example embodiment, the process of FIG. 13 is performed by integrated memory assembly 207 using any of the embodiments of a control circuit discussed above of control die 211 to program memory cells (e.g., NAND strings of memory structure 202) on memory die 201. In one embodiment, the process of FIG. 13 is performed at the direction of state machine 262 (or another processor). In one embodiment, the control circuit includes multiple circuits on multiple die programming memory cells in multiple planes on multiple die. In one embodiment, the process of FIG. 13 is performed at the direction of (or by) memory controller 120 connected to one or multiple memory die and/or multiple integrated assemblies.

In step 1302, the control circuit applies a first programming inhibit voltage during the first portion of the particular voltage pulse, applies the first programming inhibit voltage during the second portion of the particular voltage pulse, and applies the first programming inhibit voltage during the third portion of the particular voltage pulse to bit lines connected to memory cells having threshold voltages above a target magnitude prior to the particular voltage pulse. Applying the inhibit voltage to the bit lines inhibits programming of memory cells connected to the bit lines. For example, those memory cells that have already reached their target threshold voltage will be inhibited from programming during the entire pulse width of a voltage pulse used to program.

In step 1304, the control circuit applies a first programming enable voltage during the first portion of the particular voltage pulse, during the second portion of the particular voltage pulse and during the third portion of the particular voltage pulse to bit lines connected to memory cells having threshold voltages below a first magnitude prior to the particular voltage pulse. Applying the programming enable voltage to the bit lines enables programming of memory cells connected to the bit lines and the selected word line. Step 1304 is performed for memory cells that are not approaching their target threshold voltage and, therefore, do not need to have programming slowed down by reducing the effective pulse width of the voltage pulses.

In step 1306, the control circuit applies a second programming enable voltage during the first portion of the particular voltage pulse, applies the second programming enable voltage during the second portion of the particular voltage pulse, and applies a second programming inhibit voltage during the third portion of the particular voltage pulse to bit lines connected to memory cells having threshold voltages above the first magnitude and below a second magnitude prior to the particular voltage pulse. As discussed above, in the embodiment of FIGS. 11-16, there are two groups of memory cells that are approaching their target threshold voltage: the first group of memory cells approaching their target threshold voltage and the second group of memory cells approaching their target threshold voltage. The second group of memory cells approaching their target threshold voltage are closer to their target threshold voltage than the first group. Step 1306 includes slowing down programming down by reducing the effective pulse width of the voltage pulses for the first group of memory cells approaching their target threshold voltage.

In step 1308, the control circuit applies a third programming enable voltage during the first portion of the particular voltage pulse, applies a third programming inhibit voltage during the second portion of the particular voltage pulse, and applies the third programming inhibit voltage during the third portion of the particular voltage pulse to bit lines connected to memory cells having threshold voltages above the second magnitude and below the target magnitude prior to the particular voltage pulse. Step 1308 includes slowing down programming down by reducing the effective pulse width of the voltage pulses for the second group of memory cells approaching their target threshold voltage. In one embodiment, step 1306 comprises slowing down programming for the first group of memory cells approaching their target threshold voltage by reducing an effective pulse width of the voltage pulse by a first amount and step 1308 comprises slowing down programming for the second group of memory cells approaching their target threshold voltage by reducing an effective pulse width of the voltage pulse by a second amount, where the second amount is greater than the first amount.

In one embodiment, the target magnitude is a lowest voltage of a threshold voltage distribution that corresponds to a data state; the second magnitude is lower in voltage magnitude than the target magnitude and the threshold voltage distribution; and the first magnitude is lower in voltage magnitude than the second magnitude and the threshold voltage distribution.

In one embodiment, the first portion, the second portion and the third portion of the voltage pulse are equal in time duration. In other embodiments, the first portion, the second portion and the third portion are not equal in time duration.

In one embodiment, the first programming inhibit voltage is equal to the second programming inhibit voltage and the third programming inhibit voltage; and the first programming enable voltage is equal to the second programming enable voltage and the third programming enable voltage. In other embodiments, programming inhibit voltages are different and/or the programming enable voltages are different.

Note that, in some embodiments, the steps of FIG. 13 can be performed in different orders than as depicted in FIG. 13.

Figures 14, 15:
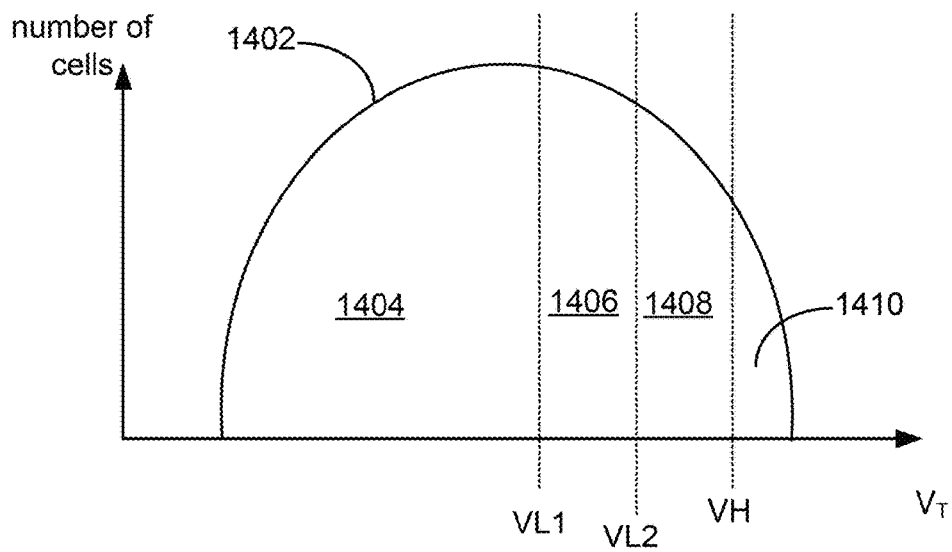
FIG. 14 depicts a threshold voltage distribution.
FIG. 15 is a table describing bit line voltages used during one embodiment of programming.

FIG. 14 depicts a threshold voltage distribution 1402 of a population of memory cells being programmed using the process of FIG. 6, with the process of FIGS. 11 and/or 12/13 being used during step 608. Threshold voltage distribution 1402 represents the threshold voltages of the memory cells after the process of FIG. 6 has started and prior to the process of FIG. 6 being completed. Threshold voltage distribution 1402 is divided into four regions: 1404, 1406, 1408 and 1410. Region 1404 includes memory cells having threshold voltages bellow VL1 volts (a first magnitude). When the next loop of steps 604-626 of FIG. 6 is performed (and the process of FIGS. 11 and/or 12/13 is performed during step 608), the memory cells of region 1404 have threshold voltages bellow VL1 volts (the first magnitude) prior to the next voltage pulse is applied and, therefore, in steps 1106 and 1304 the control circuit allows programming for the memory cells of region 1104 during the first, second and third portions of the voltage pulse of steps 1102 and 1202.

Region 1406 includes memory cells having threshold voltages above VL1 volts (the first magnitude) and below VL2 volts (a second magnitude). In one embodiment, VL1 and VL2 are intermediate voltages, with VL2 being lower in voltage magnitude from VH by 0.1-0.8 volts and VL1 being lower in voltage magnitude from VL2 by 0.1-0.8 volts. The memory cells of region 1406 are the first group of memory cells approaching their target threshold voltage and will have the effective pulse width of the voltage pulse reduced by the first amount. That is, when the next loop of steps 604-626 of FIG. 6 is performed (and the process of FIGS. 11 and/or 12/13 is performed during step 608), the memory cells of region 1406 have threshold voltages above VL1 volts (the first magnitude) and below VL2 (the second magnitude) prior to the next voltage pulse is applied and, therefore, in steps 1108 and 1306 the control circuit will reduce the effective pulse width of the voltage pulse for the memory cells of region 1406 by a first amount.

Region 1408 includes memory cells having threshold voltages above VL2 volts (the second magnitude) and below VH volts (the third magnitude). In one embodiment, VH represents the target threshold voltage (e.g., the verify compare voltages VvA, VvB, VvC, VvD, VvE, VvF, and VvG. of FIG. 5C). The memory cells of region 1408 are the second group of memory cells approaching their target threshold voltage and will have the effective pulse width of the voltage pulse reduced by the second amount. That is, when the next loop of steps 604-626 of FIG. 6 is performed (and the process of FIGS. 11 and/or 12/13 is performed during step 608), the memory cells of region 1408 have threshold voltages above VL2 volts (the second magnitude) and below VH (the third magnitude) prior to the next voltage pulse being applied and, therefore, in steps 1110 and 1308 the control circuit will reduce the effective pulse width of the voltage pulse for the memory cells of region 1408 by a second amount, such that the second amount is greater than the first amount.

Region 1410 includes memory cells having threshold voltages above VH volts (the third magnitude). The memory cells of region 1410 are the memory cells that have reached their target threshold voltage and will be inhibited from programming. That is, when the next loop of steps 604-626 of FIG. 6 is performed (and the process of FIGS. 11 and/or 12/13 are performed during step 608), the memory cells of region 1410 have threshold voltages above VH (the third magnitude) prior to the next voltage pulse being applied and, therefore, in steps 1112 and 1302 the control circuit will inhibit programming for the memory cells of region 1410 during all portions of the voltage pulse.

FIG. 15 is a table describing bit line voltages used during the processes of FIGS. 11 and/or 12/13 for the memory cells of threshold voltage distribution 1402 of FIG. 14. FIG. 15 lists two voltages that can be applied to bit lines during the processes of FIGS. 11 and/or 12/13: Vprogram and Vinhibit.

FIG. 15 shows that normal programming memory cells (e.g., the memory cells of region 1404), will have their connected bit lines at Vprogram during the first, second and third portions of the voltage pulse so that programming is allowed during the first, second and third portions of the next voltage pulse (see steps 1106 and 1304). The first group of memory cells approaching their target threshold voltage (e.g., the memory cells of region 1406), will have their connected bit lines at Vprogram during the first portion of the next voltage pulse, at Vprogram during the second portion of the next voltage pulse and at Vinhibit during the third portion of the next voltage pulse so that programming is allowed during the first portion of the next voltage pulse, programming is allowed during the second portion of the next voltage pulse and programming is inhibited during the third portion of the next voltage pulse (see steps 1108 and 1306). The second group of memory cells approaching their target threshold voltage (e.g., the memory cells of region 1408), will have their connected bit lines at Vprogram during the first portion of the next voltage pulse, at Vinhibit during the second portion of the next voltage pulse and at Vinhibit during the third portion of the next voltage pulse so that programming is allowed during the first portion of the next voltage pulse, programming is inhibited during the second portion of the next voltage pulse and programming is inhibited during the third portion of the next voltage pulse (see steps 1110 and 1308). Memory cells that have reached their target threshold voltage will be inhibited from programming during the first portion of the next voltage pulse, during the second portion of the next voltage pulse and during the third portion of the next voltage pulse (see steps 1112 and 1302) by the control circuit applying Vinhibit to their connected bit lines during the first, second and third portions of the next voltage pulse.

Figure 16:
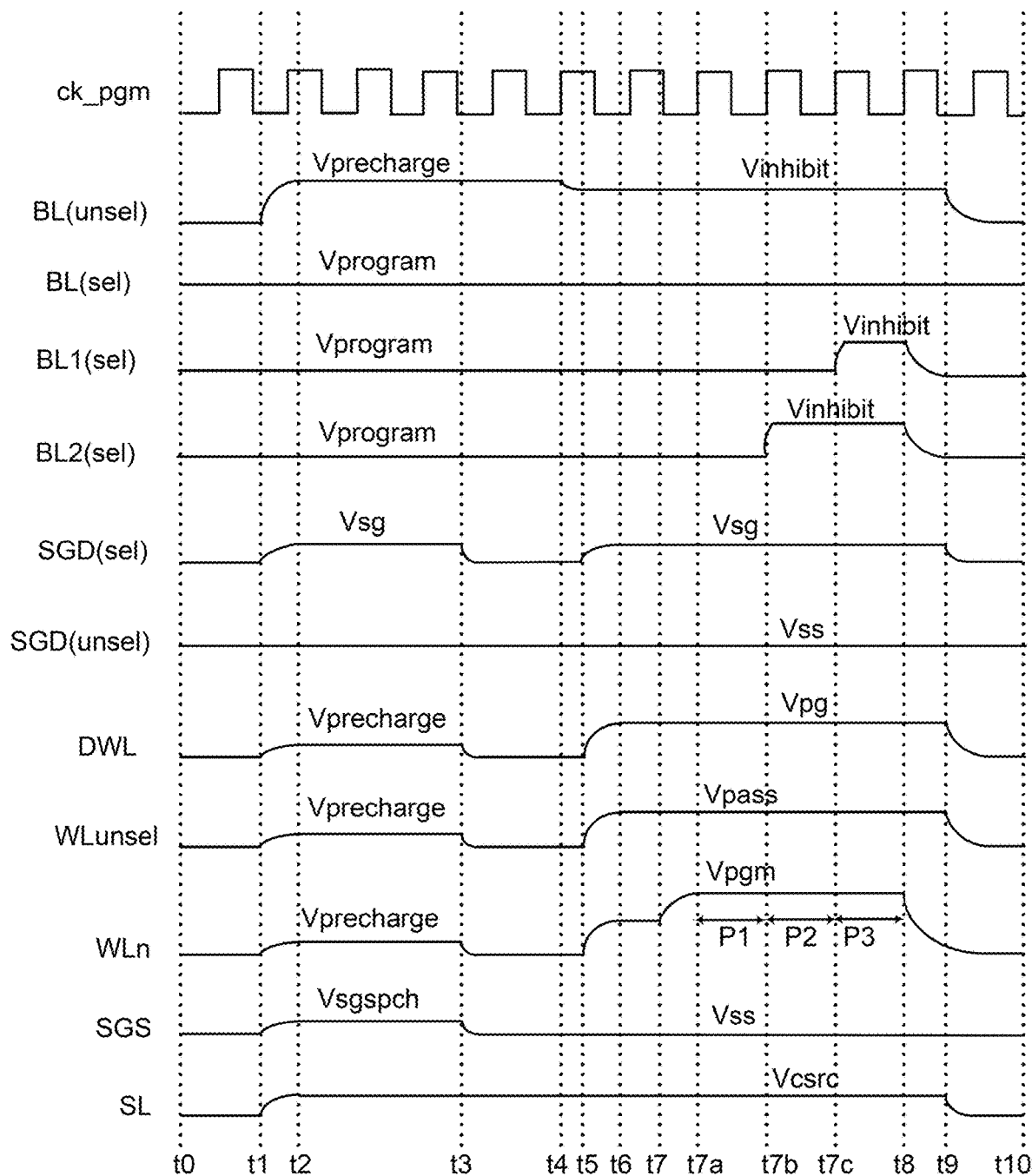
FIG. 16 is a timing diagram describing one embodiment of a process for creating tighter threshold voltage distributions during programming.

FIG. 16 is a timing diagram describing one embodiment of a process for creating tighter threshold voltage distributions during programming. FIG. 16 describes the behavior of the following signals during steps 604, 606 and 608 (as implemented by the processes of FIGS. 11 and/or 12/13): ck_pgm, BL(unsel), BL(sel), BL1(sel), BL2(sel) SGD(sel), SGD(unsel), DWL, WLunsel, WLn, SGS and SL. The signal BL1(sel) is the bit line signal applied to bit lines connected to the first group of memory cells approaching their target threshold voltage (e.g., the memory cells of region 1406); for example, BL1(sel) is applied to the bit lines connected to the NAND strings that are selected for programming and have a memory cell selected for programming that has a threshold voltage greater than VL1 and less than VL2. The signal BL2(sel) is the bit line signal applied to bit lines connected to the second group of memory cells approaching their target threshold voltage (e.g., the memory cells of region 1408); for example, BL2(sel) is applied to the bit lines connected to the NAND strings that are selected for programming and have a memory cell selected for programming that has a threshold voltage greater than VL2 and less than VH.

The signal BL(sel) is set at Vprogram for the entire time period depicted in FIG. 16. At time t1, BL(unsel) is raised from ground to Vprecharge in order to allow for pre-charging as per step 604 of FIG. 6 At time t4, the unselected bit line voltage BL(unsel) is lowered to Vinhibit and then the voltage is lowered down to ground at time t9. The signal BL1(sel) is set at Vprogram until t7c, at which time BL1(sel) is raised Vinhibit. BL1(sel) is lowered to ground at time t8. The signal BL2(sel) is set at Vprogram until time t7b, at which time BL2(sel) is raised Vinhibit. BL2(sel) is lowered to ground at time t8.

The signal SGD(unsel) is kept at Vss for the entire time period depicted in FIG. 16. At time t1, SGD (sel) is raised to Vsg which is a voltage high enough to turn on the transistor for the select gate. This allows unselected NAND strings to be pre-charged and selected NAND strings to not be pre-charged between t2 and t3. The voltage for SGD(sel) is lowered to ground at time t3, raised to Vsg at t5, and lowered to ground at t9. The source side select line SGS is raised to Vsgspch at time t1 and lowered to Vss at time t3.

The source line SL is raised from ground to Vcsrc at time t1 and then lowered to ground at time t9.

The unselected word lines WLunsel are raised to Vprecharge at time t1, lowered to ground at time t3, raised to Vpass at time t5, and lowered to ground at time t9. The signal WLunsel is set to Vprecharge in order to allow the pre-charging of step 604 of FIG. 6 and then raised to a pass voltage Vpass in order to allow the boosting of step 606 of FIG. 6. The dummy word lines DWL are raised to Vprecharge at time t1, lowered to ground at time t3, raised to Vpg at time t5, and lowered to ground at time t9. The signal DWL is raised to Vprecharge at t1 in order to allow the pre-charging of step 604 of FIG. 6 and then raised to a Vpg in order to allow the boosting of step 606 of FIG. 6. The signal WLn is raised to Vprecharge at time t1, lowered to ground at time t3, raised to the pass voltage Vpass at time t5, raised to Vpgm (the programming voltage pulse for the current loop of FIG. 6) at time t7, and lowered down to ground at time t8.

The voltage on WLn between t7 and t8 represents the voltage pulse used for programming in steps 608, 1102 and step 1202. The voltage pulse on WLn includes a first portion P1 (e.g., between t7a and t7b), a second portion P2 (e.g., between t7b and t7c), and a third portion P3 (e.g., between t7c and t8). The control circuit is configured to apply a clock signal ck_pgm that divides the voltage pulse into the first portion P1, the second portion P2 and the third portion P3 as the clock signal ck_pgm has rising edges at 7a, 7b and 7c (the start of P1, P2 and P3, respectively). The clock signal ck_pgm can be used by the control circuit to provide the timing for adjusting BL1(sel) and BL2(sel).

In one embodiment, BL(sel) implements steps 1106 and 1304 as it is at Vprogram during P1, P2 and P3. In one embodiment, BL(unsel) implements steps 1112 and 1302 as it is at Vinhibit during P1, P2 and P3. In one embodiment, BL1(sel) implements steps 1108 and 1306 as it is at Vprogram during P1 and P2 and at Vinhibit during P3. In one embodiment, BL2(sel) implements steps 1110 and 1308 as it is at Vprogram during P1 and at Vinhibit during P2 and P3.

As can be seen from FIG. 16, the control circuit is configured to change voltage levels of a first set of the bit lines (e.g., BL2(sel)) at a first time (e.g., t7b) during the particular voltage pulse and change voltage levels of a second set of the bit lines (e.g., BL1(sel)) at a second time (e.g., t7c) during the particular voltage pulse.

As can be seen from FIG. 16, the control circuit is configured to adjust bit line voltages at multiple times during one or more voltage pulses (e.g., at t7b and t7c).

A non-volatile memory has been described that programs memory cells to tighter threshold voltage distributions, which reduces errors when subsequently reading the data at a later time.

One embodiment includes a method of programming non-volatile memory. The method comprises: applying a voltage pulse to a set of non-volatile memory cells selected for programming, the voltage pulse including a first portion, a second portion subsequent to the first portion and a third portion subsequent to the second portion; allowing programming during the first portion of the voltage pulse, during the second portion of the voltage pulse and during the third portion of the voltage pulse for memory cells having threshold voltages below a first magnitude prior to the voltage pulse; allowing programming during the first portion of the voltage pulse, allowing programming during the second portion of the voltage pulse, and inhibiting programming during the third portion of the voltage pulse for memory cells having threshold voltages above the first magnitude and below a second magnitude prior to the voltage pulse; allowing programming during the first portion of the voltage pulse, inhibiting programming during the second portion of the voltage pulse, and inhibiting programming during the third portion of the voltage pulse for memory cells having threshold voltages above the second magnitude and below a third magnitude prior to the voltage pulse; and inhibiting programming during the first portion of the voltage pulse, inhibiting programming during the second portion of the voltage pulse, and inhibiting programming during the third portion of the voltage pulse for memory cells having threshold voltages above the third magnitude prior to the voltage pulse.

In one example implementation, the set of non-volatile memory cells selected for programming are connected to a common word line and different bit lines; the applying the voltage pulse to the set of non-volatile memory cells selected for programming comprises applying the voltage pulse to the common word line; and the allowing programming during the first portion of the voltage pulse, allowing programming during the second portion of the voltage pulse, and inhibiting programming during the third portion of the voltage pulse for memory cells having threshold voltages above the first magnitude and below the second magnitude prior to the voltage pulse comprises applying a programming enable voltage during the first portion of the voltage pulse, applying the programming enable voltage during the second portion of the voltage pulse, and applying a programming inhibit voltage during the third portion of the voltage pulse to bit lines connected to memory cells having threshold voltages above the first magnitude and below the second magnitude prior to the voltage pulse.

In one example implementation, the allowing programming during the first portion of the voltage pulse, inhibiting programming during the second portion of the voltage pulse, and inhibiting programming during the third portion of the voltage pulse for memory cells having threshold voltages above the second magnitude and below the third magnitude prior to the voltage pulse comprises applying the programming enable voltage during the first portion of the voltage pulse, applying the programming inhibit voltage during the second portion of the voltage pulse, and applying the programming inhibit voltage during the third portion of the voltage pulse to bit lines connected to memory cells having threshold voltages above the second magnitude and below the third magnitude prior to the voltage pulse.

In one example implementation, the allowing programming during the first portion of the voltage pulse, allowing programming during the second portion of the voltage pulse, and inhibiting programming during the third portion of the voltage pulse for memory cells having threshold voltages above the first magnitude and below a second magnitude prior to the voltage pulse comprises slowing down programming by reducing an effective pulse width of the voltage pulse by a first amount; and the allowing programming during the first portion of the voltage pulse, inhibiting programming during the second portion of the voltage pulse, and inhibiting programming during the third portion of the voltage pulse for memory cells having threshold voltages above the second magnitude and below a third magnitude prior to the voltage pulse comprises slowing down programming by reducing the effective pulse width of the voltage pulse by a second amount, the second amount is greater than the first amount.

In one example implementation, the applying a voltage pulse, allowing programming and inhibiting programming are performed by a control die 211 that is bonded to a memory die 201.

One embodiment includes a non-volatile storage apparatus, comprising: non-volatile memory cells; bit lines connected to the non-volatile memory cells; word lines connected to the non-volatile memory cells; and a control circuit connected to the non-volatile memory cells via the bit lines and the word lines. In order to program non-volatile memory cells, the control circuit is configured to apply a series of voltage pulses to a selected word line connected to a set of non-volatile memory cells selected for programming such that each of the voltage pulses include a first portion, a second portion subsequent to the first portion and a third portion subsequent to the second portion. For a particular voltage pulse of the series of voltage pulses, the control circuit is configured to apply a first programming inhibit voltage during the first portion of the particular voltage pulse, apply the first programming inhibit voltage during the second portion of the particular voltage pulse, and apply the first programming inhibit voltage during the third portion of the particular voltage pulse to bit lines connected to memory cells having threshold voltages above a target magnitude prior to the particular voltage pulse; apply a first programming enable voltage during the first portion of the particular voltage pulse, during the second portion of the particular voltage pulse and during the third portion of the particular voltage pulse to bit lines connected to memory cells having threshold voltages below a first magnitude prior to the particular voltage pulse; apply a second programming enable voltage during the first portion of the particular voltage pulse, apply the second programming enable voltage during the second portion of the particular voltage pulse, and apply a second programming inhibit voltage during the third portion of the particular voltage pulse to bit lines connected to memory cells having threshold voltages above the first magnitude and below a second magnitude prior to the particular voltage pulse; and apply a third programming enable voltage during the first portion of the particular voltage pulse, apply a third programming inhibit voltage during the second portion of the particular voltage pulse, and apply the third programming inhibit voltage during the third portion of the particular voltage pulse to bit lines connected to memory cells having threshold voltages above the second magnitude and below the target magnitude prior to the particular voltage pulse.

One embodiment includes a non-volatile storage apparatus, comprising: a memory structure comprising non-volatile memory cells; and a control circuit connected to the memory structure. The control circuit is configured to: apply a voltage pulse to a set of non-volatile memory cells selected for programming, the voltage pulse including a first portion and a second portion subsequent to the first portion; allow programming during the first portion of the voltage pulse and during the second portion of the voltage pulse for memory cells having threshold voltages below a first magnitude prior to the voltage pulse; allow programming during the first portion of the voltage pulse and inhibiting programming during the second portion of the voltage pulse for memory cells having threshold voltages above the first magnitude and below a second magnitude prior to the voltage pulse; and inhibiting programming during the first portion of the voltage pulse and during the second portion of the voltage pulse for memory cells having threshold voltages above the second magnitude prior to the voltage pulse.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method of programming non-volatile memory, the method comprising:

applying a voltage pulse to a set of non-volatile memory cells selected for programming, the voltage pulse includes a first portion, a second portion subsequent to the first portion and a third portion subsequent to the second portion;

allowing programming during the first portion of the voltage pulse, during the second portion of the voltage pulse and during the third portion of the voltage pulse for memory cells having threshold voltages below a first magnitude prior to the voltage pulse;

allowing programming during the first portion of the voltage pulse, allowing programming during the second portion of the voltage pulse, and inhibiting programming during the third portion of the voltage pulse for memory cells having threshold voltages above the first magnitude and below a second magnitude prior to the voltage pulse;

allowing programming during the first portion of the voltage pulse, inhibiting programming during the second portion of the voltage pulse, and inhibiting programming during the third portion of the voltage pulse for memory cells having threshold voltages above the second magnitude and below a third magnitude prior to the voltage pulse; and inhibiting programming during the first portion of the voltage pulse, inhibiting programming during the second portion of the voltage pulse, and inhibiting programming during the third portion of the voltage pulse for memory cells having threshold voltages above the third magnitude prior to the voltage pulse.

2. The method of claim 1, wherein:
the set of non-volatile memory cells selected for programming are connected to a common word line and different bit lines;
the applying the voltage pulse to the set of non-volatile memory cells selected for programming comprises applying the voltage pulse to the common word line; and
the allowing programming during the first portion of the voltage pulse, allowing programming during the second portion of the voltage pulse, and inhibiting programming during the third portion of the voltage pulse for memory cells having threshold voltages above the first magnitude and below the second magnitude prior to the voltage pulse comprises applying a programming enable voltage during the first portion of the voltage pulse, applying the programming enable voltage during the second portion of the voltage pulse, and applying a programming inhibit voltage during the third portion of the voltage pulse to bit lines connected to memory cells having threshold voltages above the first magnitude and below the second magnitude prior to the voltage pulse.

3. The method of claim 2, wherein:
the allowing programming during the first portion of the voltage pulse, inhibiting programming during the second portion of the voltage pulse, and inhibiting programming during the third portion of the voltage pulse for memory cells having threshold voltages above the second magnitude and below the third magnitude prior to the voltage pulse comprises applying the programming enable voltage during the first portion of the voltage pulse, applying the programming inhibit voltage during the second portion of the voltage pulse, and applying the programming inhibit voltage during the third portion of the voltage pulse to bit lines connected to memory cells having threshold voltages above the second magnitude and below the third magnitude prior to the voltage pulse.

4. The method of claim 1, wherein:
the allowing programming during the first portion of the voltage pulse, inhibiting programming during the second portion of the voltage pulse, and inhibiting programming during the third portion of the voltage pulse for memory cells having threshold voltages above the second magnitude and below the third magnitude prior to the voltage pulse comprises applying a programming enable voltage during the first portion of the voltage pulse, applying a programming inhibit voltage during the second portion of the voltage pulse, and applying the programming inhibit voltage during the third portion of the voltage pulse to bit lines connected to memory cells having threshold voltages above the second magnitude and below the third magnitude prior to the voltage pulse.

5. The method of claim 1, further comprising:
applying a clock signal that divides the voltage pulse into the first portion, the second portion and the third portion.

6. The method of claim 1, wherein:
the first portion, the second portion and the third portion are equal in time duration.

7. The method of claim 1, wherein:
the third magnitude is a lowest voltage of a threshold voltage distribution that corresponds to a data state;

the second magnitude is lower in voltage magnitude than the third magnitude and the threshold voltage distribution; and
the first magnitude is lower in voltage magnitude than the second magnitude.

8. The method of claim 1, wherein:
the applying a voltage pulse, allowing programming and inhibiting programming are performed by a control die that is bonded to a memory die.

9. The method of claim 1, wherein:
the allowing programming during the first portion of the voltage pulse, allowing programming during the second portion of the voltage pulse, and inhibiting programming during the third portion of the voltage pulse for memory cells having threshold voltages above the first magnitude and below a second magnitude prior to the voltage pulse comprises slowing down programming by reducing an effective pulse width of the voltage pulse by a first amount; and
the allowing programming during the first portion of the voltage pulse, inhibiting programming during the second portion of the voltage pulse, and inhibiting programming during the third portion of the voltage pulse for memory cells having threshold voltages above the second magnitude and below the third magnitude prior to the voltage pulse comprises slowing down programming by reducing the effective pulse width of the voltage pulse by a second amount, the second amount is greater than the first amount.

10. A non-volatile storage apparatus, comprising:
non-volatile memory cells;
bit lines connected to the non-volatile memory cells;
word lines connected to the non-volatile memory cells; and
a control circuit connected to the non-volatile memory cells via the bit lines and the word lines, in order to program non-volatile memory cells the control circuit is configured to apply a series of voltage pulses to a selected word line connected to a set of non-volatile memory cells selected for programming such that each of the voltage pulses include a first portion, a second portion subsequent to the first portion and a third portion subsequent to the second portion;
for a particular voltage pulse of the series of voltage pulses, the control circuit is configured to
apply a first programming inhibit voltage during the first portion of the particular voltage pulse, apply the first programming inhibit voltage during the second portion of the particular voltage pulse, and apply the first programming inhibit voltage during the third portion of the particular voltage pulse to bit lines connected to memory cells having threshold voltages above a target magnitude prior to the particular voltage pulse;
apply a first programming enable voltage during the first portion of the particular voltage pulse, during the second portion of the particular voltage pulse and during the third portion of the particular voltage pulse to bit lines connected to memory cells having threshold voltages below a first magnitude prior to the particular voltage pulse;
apply a second programming enable voltage during the first portion of the particular voltage pulse, apply the second programming enable voltage during the second portion of the particular voltage pulse, and apply a second programming inhibit voltage during the third portion of the particular voltage pulse to bit lines connected to memory cells having threshold voltages above the first magnitude and below a second magnitude prior to the particular voltage pulse; and apply a third programming enable voltage during the first portion of the particular voltage pulse, apply a third programming inhibit voltage during the second portion of the particular voltage pulse, and apply the third programming inhibit voltage during the third portion of the particular voltage pulse to bit lines connected to memory cells having threshold voltages above the second magnitude and below the target magnitude prior to the particular voltage pulse.

11. The non-volatile storage apparatus of claim 10, wherein:
the control circuit is configured to change voltage levels of a first set of the bit lines at a first time during the particular voltage pulse and change voltage levels of a second set of the bit lines at a second time during the particular voltage pulse.

12. The non-volatile storage apparatus of claim 10, wherein:
the control circuit is configured to apply a clock signal that divides the particular voltage pulse into the first portion, the second portion and the third portion.

13. The non-volatile storage apparatus of claim 10, wherein:
the target magnitude is a lowest voltage of a threshold voltage distribution that corresponds to a data state;
the second magnitude is lower in voltage magnitude than the target magnitude and the threshold voltage distribution; and
the first magnitude is lower in voltage magnitude than the second magnitude.

14. The non-volatile storage apparatus of claim 10, wherein:
the control circuit is configured to adjust bit line voltages at multiple times during multiple voltage pulse of the series of voltage pulses.

15. The non-volatile storage apparatus of claim 10, wherein:
the first portion, the second portion and the third portion are equal in time duration.

16. The non-volatile storage apparatus of claim 10, wherein:
the first programming inhibit voltage is equal to the second programming inhibit voltage and the third programming inhibit voltage; and
the first programming enable voltage is equal to the second programming enable voltage and the third programming enable voltage.

17. The non-volatile storage apparatus of claim 10, wherein:
the non-volatile memory cells, bit lines and word lines are positioned on a memory die; and
the control circuit is positioned on a control die that is separate from and bonded to the memory die.

18. The non-volatile storage apparatus of claim 10, wherein:
the non-volatile memory cells comprise a three dimensional non-volatile memory array.

19. A non-volatile storage apparatus, comprising:
a memory structure comprising non-volatile memory cells; and
a control circuit connected to the memory structure, the control circuit is configured to:
apply a voltage pulse to a set of non-volatile memory cells selected for programming, the voltage pulse including a first portion and a second portion subsequent to the first portion;
allow programming during the first portion of the voltage pulse and during the second portion of the voltage pulse for memory cells having threshold voltages below a first magnitude prior to the voltage pulse;
allow programming during the first portion of the voltage pulse and inhibiting programming during the second portion of the voltage pulse for memory cells having threshold voltages above the first magnitude and below a second magnitude prior to the voltage pulse; and
inhibiting programming during the first portion of the voltage pulse and during the second portion of the voltage pulse for memory cells having threshold voltages above the second magnitude prior to the voltage pulse.

20. The non-volatile storage apparatus of claim 19, further comprising:
bit lines connected to the non-volatile memory cells; and
word lines connected to the non-volatile memory cells, the control circuit is connected to the non-volatile memory cells via the bit lines and the word lines, the set of non-volatile memory cells selected for programming are connected to a common word line and different bit lines;
the control circuit is configured to allow programming during the first portion of the voltage pulse and inhibiting programming during the second portion of the voltage pulse for memory cells by applying a programming enable voltage during the first portion of the voltage pulse and applying a programming inhibit voltage during the second portion of the voltage pulse to bit lines connected to memory cells having threshold voltages above the first magnitude and below the second magnitude prior to the voltage pulse.

* * * * *